(12) United States Patent
Helbig, Sr.

(10) Patent No.: US 7,546,516 B2
(45) Date of Patent: Jun. 9, 2009

(54) SYSTEM AND METHOD FOR FORWARD ERROR CORRECTION

(75) Inventor: Walter A. Helbig, Sr., Medford Lakes, NJ (US)

(73) Assignee: The Helbig Company, LLC

( * ) Notice: Subject to any disclaimer, the term of this patent is extended or adjusted under 35 U.S.C. 154(b) by 514 days.

(21) Appl. No.: 10/507,823

(22) PCT Filed: Mar. 13, 2003

(86) PCT No.: PCT/US03/07769

§ 371 (c)(1), (2), (4) Date: Sep. 14, 2004

(87) PCT Pub. No.: WO03/079556

PCT Pub. Date: Sep. 25, 2003

(65) Prior Publication Data
US 2005/0138525 A1    Jun. 23, 2005

Related U.S. Application Data

(60) Provisional application No. 60/364,894, filed on Mar. 14, 2002.

(51) Int. Cl.
*H03M 13/00* (2006.01)

(52) U.S. Cl. .................................. 714/774; 714/762
(58) Field of Classification Search ................ 714/774, 714/762
See application file for complete search history.

(56) References Cited

U.S. PATENT DOCUMENTS

| 4,556,960 A | * | 12/1985 | Cohn et al. | 711/218 |
| 4,665,537 A | * | 5/1987 | Moriyama | 714/755 |
| 5,708,667 A | * | 1/1998 | Hayashi | 714/755 |
| 5,751,740 A | * | 5/1998 | Helbig, Sr. | 714/768 |

* cited by examiner

*Primary Examiner*—Mujtaba K. Chaudry
(74) *Attorney, Agent, or Firm*—Morgan, Lewis & Bockius LLP

(57) ABSTRACT

Prior to transmission, data bits are arranged into matrices having blocks sized in accordance with a size or rate of an error burst. The matrices are arranged into an ordered set having first and second dimensions. One or more sets of check bits are generated for each block of data bits. At least one set of first check bits relates to the first dimension, and at least one set of second check bits relates to said second dimension. The ordered set of matrices is transmitted across a transmission channel and received at a decoder-corrector. One or more errors in data bits of the ordered set of matrices are detected and corrected, by the decoder-corrector, based on the check bits.

7 Claims, 19 Drawing Sheets

PRIOR ART

| | | | | | | | | | | | | | | |
|---|---|---|---|---|---|---|---|---|---|---|---|---|---|---|
| $D_1$ | $D_6$ | $D_{12}$ | $D_{18}$ | $D_{24}$ | $D_{30}$ | 0 | 0 | $C_1$ | 0 | 0 | $D_{60}$ | $D_{64}$ | $D_{68}$ | $D_{72}$ |
| $D_2$ | $D_6$ | $D_{11}$ | $D_{17}$ | $D_{23}$ | $D_{29}$ | $D_{35}$ | 0 | 0 | $C_2$ | 0 | 0 | $D_{65}$ | $D_{69}$ | $D_{73}$ |
| $D_3$ | $D_7$ | $D_{11}$ | $D_{16}$ | $D_{22}$ | $D_{28}$ | $D_{34}$ | $D_{40}$ | 0 | 0 | $C_3$ | 0 | 0 | $D_{70}$ | $D_{74}$ |
| $D_4$ | $D_8$ | $D_{12}$ | $D_{16}$ | $D_{21}$ | $D_{27}$ | $D_{33}$ | $D_{39}$ | $D_{45}$ | 0 | 0 | $C_4$ | 0 | 0 | $D_{75}$ |
| $D_5$ | $D_9$ | $D_{13}$ | $D_{17}$ | $D_{21}$ | $D_{26}$ | $D_{32}$ | $D_{38}$ | $D_{44}$ | $D_{50}$ | 0 | 0 | $C_5$ | 0 | 0 |
| 0 | $D_{10}$ | $D_{14}$ | $D_{18}$ | $D_{22}$ | $D_{26}$ | $D_{31}$ | $D_{37}$ | $D_{43}$ | $D_{49}$ | $D_{55}$ | 0 | 0 | $C_6$ | 0 |
| 0 | 0 | $D_{15}$ | $D_{19}$ | $D_{23}$ | $D_{27}$ | $D_{31}$ | $D_{36}$ | $D_{42}$ | $D_{48}$ | $D_{54}$ | $D_{60}$ | 0 | 0 | $C_7$ |
| $C_8$ | 0 | 0 | $D_{20}$ | $D_{24}$ | $D_{28}$ | $D_{32}$ | $D_{36}$ | $D_{41}$ | $D_{47}$ | $D_{53}$ | $D_{59}$ | $D_{65}$ | 0 | 0 |
| 0 | $C_9$ | 0 | 0 | $D_{25}$ | $D_{29}$ | $D_{33}$ | $D_{37}$ | $D_{41}$ | $D_{46}$ | $D_{52}$ | $D_{58}$ | $D_{64}$ | $D_{70}$ | 0 |
| 0 | 0 | $C_{10}$ | 0 | 0 | $D_{30}$ | $D_{34}$ | $D_{38}$ | $D_{42}$ | $D_{46}$ | $D_{51}$ | $D_{57}$ | $D_{63}$ | $D_{69}$ | $D_{75}$ |
| $D_5$ | 0 | 0 | $C_{11}$ | 0 | 0 | $D_{35}$ | $D_{39}$ | $D_{43}$ | $D_{47}$ | $D_{51}$ | $D_{56}$ | $D_{62}$ | $D_{68}$ | $D_{74}$ |
| $D_4$ | $D_{10}$ | 0 | 0 | $C_{12}$ | 0 | 0 | $D_{40}$ | $D_{44}$ | $D_{48}$ | $D_{52}$ | $D_{56}$ | $D_{61}$ | $D_{67}$ | $D_{73}$ |
| $D_3$ | $D_9$ | $D_{15}$ | 0 | 0 | $C_{13}$ | 0 | 0 | $D_{45}$ | $D_{49}$ | $D_{53}$ | $D_{57}$ | $D_{61}$ | $D_{66}$ | $D_{72}$ |
| $D_2$ | $D_8$ | $D_{14}$ | $D_{20}$ | 0 | 0 | $C_{14}$ | 0 | 0 | $D_{50}$ | $D_{54}$ | $D_{58}$ | $D_{62}$ | $D_{66}$ | $D_{71}$ |
| $D_1$ | $D_7$ | $D_{13}$ | $D_{19}$ | $D_{25}$ | 0 | 0 | $C_{15}$ | 0 | 0 | $D_{55}$ | $D_{59}$ | $D_{63}$ | $D_{67}$ | $D_{71}$ |

Note: $C_N$ = Modulo Two Sum Of The Nth Row Data Bits

Original Code Arrangement
For Block Error Correction
FIG. 1

FIG. 2

| | | | | | | | | | | | | | | |
|---|---|---|---|---|---|---|---|---|---|---|---|---|---|---|
| $D_2$ | $D_6$ | $D_{11}$ | $D_{17}$ | $D_{23}$ | $D_{29}$ | $D_{35}$ | 0 | 0 | $C_1$ | 0 | 0 | $D_{65}$ | $D_{69}$ | $D_{73}$ |
| $D_3$ | $D_7$ | $D_{11}$ | $D_{16}$ | $D_{22}$ | $D_{28}$ | $D_{34}$ | $D_{40}$ | 0 | 0 | $C_2$ | 0 | 0 | $D_{70}$ | $D_{74}$ |
| $D_4$ | $D_8$ | $D_{12}$ | $D_{16}$ | $D_{21}$ | $D_{27}$ | $D_{33}$ | $D_{39}$ | $D_{45}$ | 0 | 0 | $C_3$ | 0 | 0 | $D_{75}$ |
| $D_5$ | $D_9$ | $D_{13}$ | $D_{17}$ | $D_{21}$ | $D_{26}$ | $D_{32}$ | $D_{38}$ | $D_{44}$ | $D_{50}$ | 0 | 0 | $C_4$ | 0 | 0 |
| 0 | $D_{10}$ | $D_{14}$ | $D_{18}$ | $D_{22}$ | $D_{26}$ | $D_{31}$ | $D_{37}$ | $D_{43}$ | $D_{49}$ | $D_{55}$ | 0 | 0 | $C_5$ | 0 |
| 0 | 0 | $D_{15}$ | $D_{19}$ | $D_{23}$ | $D_{27}$ | $D_{31}$ | $D_{36}$ | $D_{42}$ | $D_{48}$ | $D_{54}$ | $D_{60}$ | 0 | 0 | $C_6$ |
| $C_7$ | 0 | 0 | $D_{20}$ | $D_{24}$ | $D_{28}$ | $D_{32}$ | $D_{36}$ | $D_{41}$ | $D_{47}$ | $D_{53}$ | $D_{59}$ | $D_{65}$ | 0 | 0 |
| 0 | $C_8$ | 0 | 0 | $D_{25}$ | $D_{29}$ | $D_{33}$ | $D_{37}$ | $D_{41}$ | $D_{46}$ | $D_{52}$ | $D_{58}$ | $D_{64}$ | $D_{70}$ | 0 |
| 0 | 0 | $C_9$ | 0 | 0 | $D_{30}$ | $D_{34}$ | $D_{38}$ | $D_{42}$ | $D_{46}$ | $D_{51}$ | $D_{57}$ | $D_{63}$ | $D_{69}$ | $D_{75}$ |
| $D_5$ | 0 | 0 | $C_{10}$ | 0 | 0 | $D_{35}$ | $D_{39}$ | $D_{43}$ | $D_{47}$ | $D_{51}$ | $D_{56}$ | $D_{62}$ | $D_{68}$ | $D_{74}$ |
| $D_4$ | $D_{10}$ | 0 | 0 | $C_{11}$ | 0 | 0 | $D_{40}$ | $D_{44}$ | $D_{48}$ | $D_{52}$ | $D_{56}$ | $D_{61}$ | $D_{67}$ | $D_{73}$ |
| $D_3$ | $D_9$ | $D_{15}$ | 0 | 0 | $C_{12}$ | 0 | 0 | $D_{45}$ | $D_{49}$ | $D_{53}$ | $D_{57}$ | $D_{61}$ | $D_{66}$ | $D_{72}$ |
| $D_2$ | $D_8$ | $D_{14}$ | $D_{20}$ | 0 | 0 | $C_{13}$ | 0 | 0 | $D_{50}$ | $D_{54}$ | $D_{58}$ | $D_{62}$ | $D_{66}$ | $D_{71}$ |
| $D_1$ | $D_7$ | $D_{13}$ | $D_{19}$ | $D_{25}$ | 0 | 0 | $C_{14}$ | 0 | 0 | $D_{55}$ | $D_{59}$ | $D_{63}$ | $D_{67}$ | $D_{71}$ |
| $D_1$ | $D_6$ | $D_{12}$ | $D_{18}$ | $D_{24}$ | $D_{30}$ | 0 | 0 | $C_{15}$ | 0 | 0 | $D_{60}$ | $D_{64}$ | $D_{68}$ | $D_{72}$ |

Note: $C_N$ = Modulo Two Sum Of The Nth Row Data Bits

Original Code Arrangement
For Block Error Correction
With One Change As Shown

FIG. 3

| $D_1$ | $D_6$ | $D_{12}$ | $D_{18}$ | $D_{24}$ | $D_{30}$ | 0 | 0 | $C_1$ | 0 | 0 | $D_{60}$ | $D_{64}$ | $D_{67}$ | $D_{73}$ |
|---|---|---|---|---|---|---|---|---|---|---|---|---|---|---|
| $D_2$ | $D_6$ | $D_{11}$ | $D_{17}$ | $D_{23}$ | $D_{29}$ | $D_{35}$ | 0 | 0 | $C_2$ | 0 | 0 | $D_{65}$ | $D_{68}$ | $D_{74}$ |
| $D_3$ | $D_7$ | $D_{11}$ | $D_{16}$ | $D_{22}$ | $D_{28}$ | $D_{34}$ | $D_{40}$ | 0 | 0 | $C_3$ | 0 | 0 | $D_{69}$ | $D_{75}$ |
| $D_4$ | $D_8$ | $D_{12}$ | $D_{16}$ | $D_{21}$ | $D_{27}$ | $D_{33}$ | $D_{39}$ | $D_{45}$ | 0 | 0 | $C_4$ | 0 | $D_{70}$ | 0 |
| $D_5$ | $D_9$ | $D_{13}$ | $D_{17}$ | $D_{21}$ | $D_{26}$ | $D_{32}$ | $D_{38}$ | $D_{44}$ | $D_{50}$ | 0 | 0 | $C_5$ | 0 | 0 |
| 0 | $D_{10}$ | $D_{14}$ | $D_{18}$ | $D_{22}$ | $D_{26}$ | $D_{31}$ | $D_{37}$ | $D_{43}$ | $D_{49}$ | $D_{55}$ | 0 | 0 | 0 | $C_6$ |
| 0 | 0 | $D_{15}$ | $D_{19}$ | $D_{23}$ | $D_{27}$ | $D_{31}$ | $D_{36}$ | $D_{42}$ | $D_{48}$ | $D_{54}$ | $D_{60}$ | 0 | $C_7$ | 0 |
| $C_8$ | 0 | 0 | $D_{20}$ | $D_{24}$ | $D_{28}$ | $D_{32}$ | $D_{36}$ | $D_{41}$ | $D_{47}$ | $D_{53}$ | $D_{59}$ | $D_{65}$ | 0 | 0 |
| 0 | $C_9$ | 0 | 0 | $D_{25}$ | $D_{29}$ | $D_{33}$ | $D_{37}$ | $D_{41}$ | $D_{46}$ | $D_{52}$ | $D_{58}$ | $D_{64}$ | 0 | $D_{75}$ |
| 0 | 0 | $C_{10}$ | 0 | 0 | $D_{30}$ | $D_{34}$ | $D_{38}$ | $D_{42}$ | $D_{46}$ | $D_{51}$ | $D_{57}$ | $D_{63}$ | $D_{70}$ | $D_{74}$ |
| $D_5$ | 0 | 0 | $C_{11}$ | 0 | 0 | $D_{35}$ | $D_{39}$ | $D_{43}$ | $D_{47}$ | $D_{51}$ | $D_{56}$ | $D_{62}$ | $D_{69}$ | $D_{73}$ |
| $D_4$ | $D_{10}$ | 0 | 0 | $C_{12}$ | 0 | 0 | $D_{40}$ | $D_{44}$ | $D_{48}$ | $D_{52}$ | $D_{56}$ | $D_{61}$ | $D_{68}$ | $D_{72}$ |
| $D_3$ | $D_9$ | $D_{15}$ | 0 | 0 | $C_{13}$ | 0 | 0 | $D_{45}$ | $D_{49}$ | $D_{53}$ | $D_{57}$ | $D_{61}$ | $D_{67}$ | $D_{71}$ |
| $D_2$ | $D_8$ | $D_{14}$ | $D_{20}$ | 0 | 0 | $C_{14}$ | 0 | 0 | $D_{50}$ | $D_{54}$ | $D_{58}$ | $D_{62}$ | $D_{66}$ | $D_{71}$ |
| $D_1$ | $D_7$ | $D_{13}$ | $D_{19}$ | $D_{25}$ | 0 | 0 | $C_{15}$ | 0 | 0 | $D_{55}$ | $D_{59}$ | $D_{63}$ | $D_{66}$ | $D_{72}$ |

Note: $C_N$ = Modulo Two Sum Of The Nth Row Data Bits 

Original Code Arrangement
For Block Error Correction
With A Different Change As Shown

FIG. 4

| | | | | | | | | | | | | | | |
|---|---|---|---|---|---|---|---|---|---|---|---|---|---|---|
| $D_1$ | $D_8$ | $D_{14}$ | $D_{20}$ | $D_{21}$ | $D_{27}$ | 0 | 0 | $C_1$ | 0 | 0 | $D_{60}$ | $D_{64}$ | $D_{68}$ | $D_{72}$ |
| $D_2$ | $D_6$ | $D_{13}$ | $D_{19}$ | $D_{25}$ | $D_{26}$ | $D_{32}$ | 0 | 0 | $C_2$ | 0 | 0 | $D_{65}$ | $D_{69}$ | $D_{73}$ |
| $D_3$ | $D_7$ | $D_{11}$ | $D_{18}$ | $D_{24}$ | $D_{30}$ | $D_{31}$ | $D_{37}$ | 0 | 0 | $C_3$ | 0 | 0 | $D_{70}$ | $D_{74}$ |
| $D_4$ | $D_8$ | $D_{12}$ | $D_{16}$ | $D_{23}$ | $D_{29}$ | $D_{35}$ | $D_{36}$ | $D_{42}$ | 0 | 0 | $C_4$ | 0 | 0 | $D_{75}$ |
| $D_5$ | $D_9$ | $D_{13}$ | $D_{17}$ | $D_{21}$ | $D_{28}$ | $D_{34}$ | $D_{40}$ | $D_{41}$ | $D_{47}$ | 0 | 0 | $C_5$ | 0 | 0 |
| 0 | $D_{10}$ | $D_{14}$ | $D_{18}$ | $D_{22}$ | $D_{26}$ | $D_{33}$ | $D_{39}$ | $D_{45}$ | $D_{46}$ | $D_{52}$ | 0 | 0 | $C_6$ | 0 |
| 0 | 0 | $D_{15}$ | $D_{19}$ | $D_{23}$ | $D_{27}$ | $D_{31}$ | $D_{38}$ | $D_{44}$ | $D_{50}$ | $D_{51}$ | $D_{57}$ | 0 | 0 | $C_7$ |
| $C_8$ | 0 | 0 | $D_{20}$ | $D_{24}$ | $D_{28}$ | $D_{32}$ | $D_{36}$ | $D_{43}$ | $D_{49}$ | $D_{55}$ | $D_{56}$ | $D_{62}$ | 0 | 0 |
| 0 | $C_9$ | 0 | 0 | $D_{25}$ | $D_{29}$ | $D_{33}$ | $D_{37}$ | $D_{41}$ | $D_{48}$ | $D_{54}$ | $D_{60}$ | $D_{61}$ | $D_{67}$ | 0 |
| 0 | 0 | $C_{10}$ | 0 | 0 | $D_{30}$ | $D_{34}$ | $D_{38}$ | $D_{42}$ | $D_{46}$ | $D_{53}$ | $D_{59}$ | $D_{65}$ | $D_{66}$ | $D_{72}$ |
| $D_2$ | 0 | 0 | $C_{11}$ | 0 | 0 | $D_{35}$ | $D_{39}$ | $D_{43}$ | $D_{47}$ | $D_{51}$ | $D_{58}$ | $D_{64}$ | $D_{70}$ | $D_{71}$ |
| $D_1$ | $D_7$ | 0 | 0 | $C_{12}$ | 0 | 0 | $D_{40}$ | $D_{44}$ | $D_{48}$ | $D_{52}$ | $D_{56}$ | $D_{63}$ | $D_{69}$ | $D_{75}$ |
| $D_5$ | $D_6$ | $D_{12}$ | 0 | 0 | $C_{13}$ | 0 | 0 | $D_{45}$ | $D_{49}$ | $D_{53}$ | $D_{57}$ | $D_{61}$ | $D_{68}$ | $D_{74}$ |
| $D_4$ | $D_{10}$ | $D_{11}$ | $D_{17}$ | 0 | 0 | $C_{14}$ | 0 | 0 | $D_{50}$ | $D_{54}$ | $D_{58}$ | $D_{62}$ | $D_{66}$ | $D_{73}$ |
| $D_3$ | $D_9$ | $D_{15}$ | $D_{16}$ | $D_{22}$ | 0 | 0 | $C_{15}$ | 0 | 0 | $D_{55}$ | $D_{59}$ | $D_{63}$ | $D_{67}$ | $D_{71}$ |

Note: $C_N$ = Modulo Two Sum Of The Nth Row Data Bits

Code Block Error Correction Arrangement
With Half Of The Data Bits Rotated For
A Different Change As Shown

FIG. 5

| | | | | | | | | | | | | | | |
|---|---|---|---|---|---|---|---|---|---|---|---|---|---|---|
| $D_1$ | $D_{11}$ | $D_{22}$ | $D_{33}$ | $D_{44}$ | $D_{55}$ | 0 | 0 | $C_{1A}$ | 0 | 0 | $D_{115}$ | $D_{124}$ | $D_{133}$ | $D_{142}$ |
| $D_2$ | $D_{11}$ | $D_{21}$ | $D_{32}$ | $D_{43}$ | $D_{54}$ | $D_{65}$ | 0 | 0 | $C_{2A}$ | 0 | 0 | $D_{125}$ | $D_{134}$ | $D_{143}$ |
| $D_3$ | $D_{12}$ | $D_{21}$ | $D_{31}$ | $D_{42}$ | $D_{53}$ | $D_{64}$ | $D_{75}$ | 0 | 0 | $C_{3A}$ | 0 | 0 | $D_{135}$ | $D_{144}$ |
| $D_4$ | $D_{13}$ | $D_{22}$ | $D_{31}$ | $D_{41}$ | $D_{52}$ | $D_{63}$ | $D_{74}$ | $D_{85}$ | 0 | 0 | $C_{4A}$ | 0 | 0 | $D_{145}$ |
| $D_5$ | $D_{14}$ | $D_{23}$ | $D_{32}$ | $D_{41}$ | $D_{51}$ | $D_{62}$ | $D_{73}$ | $D_{84}$ | $D_{95}$ | 0 | 0 | $C_{5A}$ | 0 | 0 |
| 0 | $D_{15}$ | $D_{24}$ | $D_{33}$ | $D_{42}$ | $D_{51}$ | $D_{61}$ | $D_{72}$ | $D_{83}$ | $D_{94}$ | $D_{105}$ | 0 | 0 | $C_{6A}$ | 0 |
| 0 | 0 | $D_{25}$ | $D_{34}$ | $D_{43}$ | $D_{52}$ | $D_{61}$ | $D_{71}$ | $D_{22}$ | $D_{93}$ | $D_{104}$ | $D_{115}$ | 0 | 0 | $C_{7A}$ |
| $C_{8A}$ | 0 | 0 | $D_{35}$ | $D_{44}$ | $D_{53}$ | $D_{62}$ | $D_{71}$ | $D_{81}$ | $D_{92}$ | $D_{103}$ | $D_{114}$ | $D_{125}$ | 0 | 0 |
| 0 | $C_{9A}$ | 0 | 0 | $D_{45}$ | $D_{54}$ | $D_{63}$ | $D_{72}$ | $D_{81}$ | $D_{91}$ | $D_{102}$ | $D_{113}$ | $D_{124}$ | $D_{135}$ | 0 |
| 0 | 0 | $C_{10A}$ | 0 | 0 | $D_{55}$ | $D_{64}$ | $D_{73}$ | $D_{82}$ | $D_{91}$ | $D_{101}$ | $D_{112}$ | $D_{123}$ | $D_{134}$ | $D_{145}$ |
| $D_5$ | 0 | 0 | $C_{11A}$ | 0 | 0 | $D_{65}$ | $D_{74}$ | $D_{83}$ | $D_{92}$ | $D_{101}$ | $D_{111}$ | $D_{122}$ | $D_{133}$ | $D_{144}$ |
| $D_4$ | $D_{15}$ | 0 | 0 | $C_{12A}$ | 0 | 0 | $D_{75}$ | $D_{84}$ | $D_{93}$ | $D_{102}$ | $D_{111}$ | $D_{121}$ | $D_{132}$ | $D_{143}$ |
| $D_3$ | $D_{14}$ | $D_{25}$ | 0 | 0 | $C_{13A}$ | 0 | 0 | $D_{85}$ | $D_{94}$ | $D_{103}$ | $D_{112}$ | $D_{121}$ | $D_{131}$ | $D_{142}$ |
| $D_2$ | $D_{13}$ | $D_{24}$ | $D_{35}$ | 0 | 0 | $C_{14A}$ | 0 | 0 | $D_{95}$ | $D_{104}$ | $D_{113}$ | $D_{122}$ | $D_{131}$ | $D_{141}$ |
| $D_1$ | $D_{12}$ | $D_{23}$ | $D_{34}$ | $D_{45}$ | 0 | 0 | $C_{15A}$ | 0 | 0 | $D_{105}$ | $D_{114}$ | $D_{123}$ | $D_{132}$ | $D_{141}$ |

Note: $C_N$ = Modulo Two Sum Of The Nth Row Data Bits

Original Code Arrangement
Phase 1 For Burst Error Correction

FIG. 6

| | | | | | | | | | | | | | |
|---|---|---|---|---|---|---|---|---|---|---|---|---|---|
| $D_6$ | $D_{16}$ | $D_{27}$ | $D_{38}$ | $D_{49}$ | $D_{60}$ | 0 | 0 | $C_{1B}$ | 0 | 0 | $D_{120}$ | $D_{129}$ | $D_{138}$ | $D_{147}$ |
| $D_7$ | $D_{16}$ | $D_{26}$ | $D_{37}$ | $D_{48}$ | $D_{59}$ | $D_{70}$ | 0 | 0 | $C_{2B}$ | 0 | 0 | $D_{130}$ | $D_{139}$ | $D_{148}$ |
| $D_8$ | $D_{17}$ | $D_{26}$ | $D_{36}$ | $D_{47}$ | $D_{58}$ | $D_{69}$ | $D_{80}$ | 0 | 0 | $C_{3B}$ | 0 | 0 | $D_{140}$ | $D_{149}$ |
| $D_9$ | $D_{18}$ | $D_{27}$ | $D_{36}$ | $D_{46}$ | $D_{57}$ | $D_{68}$ | $D_{79}$ | $D_{90}$ | 0 | 0 | $C_{4AB}$ | 0 | 0 | $D_{150}$ |
| $D_{10}$ | $D_{19}$ | $D_{28}$ | $D_{37}$ | $D_{46}$ | $D_{56}$ | $D_{67}$ | $D_{78}$ | $D_{89}$ | $D_{100}$ | 0 | 0 | $C_{5B}$ | 0 | 0 |
| 0 | $D_{20}$ | $D_{29}$ | $D_{38}$ | $D_{47}$ | $D_{56}$ | $D_{66}$ | $D_{77}$ | $D_{88}$ | $D_{99}$ | $D_{110}$ | 0 | 0 | $C_{6B}$ | 0 |
| 0 | 0 | $D_{30}$ | $D_{39}$ | $D_{48}$ | $D_{57}$ | $D_{66}$ | $D_{76}$ | $D_{27}$ | $D_{98}$ | $D_{109}$ | $D_{120}$ | 0 | 0 | $C_{7B}$ |
| $C_{8B}$ | 0 | 0 | $D_{40}$ | $D_{49}$ | $D_{58}$ | $D_{67}$ | $D_{76}$ | $D_{86}$ | $D_{97}$ | $D_{108}$ | $D_{119}$ | $D_{130}$ | 0 | 0 |
| 0 | $C_{9B}$ | 0 | 0 | $D_{50}$ | $D_{59}$ | $D_{68}$ | $D_{77}$ | $D_{86}$ | $D_{96}$ | $D_{107}$ | $D_{118}$ | $D_{129}$ | $D_{140}$ | 0 |
| 0 | 0 | $C_{10B}$ | 0 | 0 | $D_{60}$ | $D_{69}$ | $D_{78}$ | $D_{87}$ | $D_{96}$ | $D_{106}$ | $D_{117}$ | $D_{128}$ | $D_{139}$ | $D_{150}$ |
| $D_{10}$ | 0 | 0 | $C_{11B}$ | 0 | 0 | $D_{70}$ | $D_{79}$ | $D_{88}$ | $D_{97}$ | $D_{106}$ | $D_{116}$ | $D_{127}$ | $D_{138}$ | $D_{149}$ |
| $D_9$ | $D_{20}$ | 0 | 0 | $C_{12B}$ | 0 | 0 | $D_{80}$ | $D_{89}$ | $D_{98}$ | $D_{107}$ | $D_{116}$ | $D_{126}$ | $D_{137}$ | $D_{148}$ |
| $D_8$ | $D_{19}$ | $D_{30}$ | 0 | 0 | $C_{13B}$ | 0 | 0 | $D_{90}$ | $D_{99}$ | $D_{108}$ | $D_{117}$ | $D_{126}$ | $D_{136}$ | $D_{147}$ |
| $D_7$ | $D_{18}$ | $D_{29}$ | $D_{40}$ | 0 | 0 | $C_{14B}$ | 0 | 0 | $D_{100}$ | $D_{109}$ | $D_{118}$ | $D_{127}$ | $D_{136}$ | $D_{146}$ |
| $D_6$ | $D_{17}$ | $D_{28}$ | $D_{39}$ | $D_{50}$ | 0 | 0 | $C_{15B}$ | 0 | 0 | $D_{110}$ | $D_{119}$ | $D_{128}$ | $D_{137}$ | $D_{146}$ |

Note: $C_N$ = Modulo Two Sum Of The Nth Row Data Bits

Original Code Arrangement
Phase 2 For Burst Error Correction

*Maximum Error Burst Length*
*# Data Bits + Check Bit Per Column + 1*

| $D_1 - D_5$ | $C_{8A}$ | $D_6 - D_{10}$ | $C_{8B}$ | $D_{11} - D_{15}$ | $C_{9A}$ | $D_{16} - D_{20}$ | $C_{9B}$ |

| $D_{21} - D_{25}$ | $C_{10A}$ | $D_{26} - D_{30}$ | $C_{10B}$ | $D_{31} - D_{35}$ | $C_{11A}$ | $D_{36} - D_{40}$ | $C_{11B}$ |

| $D_{41} - D_{45}$ | $C_{12A}$ | $D_{46} - D_{50}$ | $C_{12B}$ | $D_{51} - D_{55}$ | $C_{13A}$ | $D_{56} - D_{60}$ | $C_{13B}$ |

| $D_{61} - D_{65}$ | $C_{14A}$ | $D_{66} - D_{70}$ | $C_{14B}$ | $D_{71} - D_{75}$ | $C_{15A}$ | $D_{76} - D_{80}$ | $C_{15B}$ |

| $D_{81} - D_{85}$ | $C_{1A}$ | $D_{86} - D_{90}$ | $C_{1B}$ | $D_{91} - D_{95}$ | $C_{2A}$ | $D_{96} - D_{100}$ | $C_{2B}$ |

| $D_{101} - D_{105}$ | $C_{3A}$ | $D_{106} - D_{110}$ | $C_{3B}$ | $D_{111} - D_{115}$ | $C_{4A}$ | $D_{116} - D_{120}$ | $C_{4B}$ |

| $D_{121} - D_{125}$ | $C_{5A}$ | $D_{126} - D_{130}$ | $C_{5B}$ | $D_{131} - D_{135}$ | $C_{6A}$ | $D_{136} - D_{140}$ | $C_{6B}$ |

| $D_{141} - D_{145}$ | $C_{7A}$ | $D_{146} - D_{150}$ | $C_{7B}$ | $D_{151} - D_{155}$ | $C_{8A}$ | • • •

FIG. 7

Transmission Sequence For The
Original Code Arrangement
Interleaved For Burst Error Correction

FIG. 8

| | | | | | | | | | | | | | | |
|---|---|---|---|---|---|---|---|---|---|---|---|---|---|---|
| $D_1$ | $D_6$ | $D_{12}$ | $D_{18}$ | $D_{24}$ | $D_{30}$ | 0 | 0 | $C_{1A}$ | 0 | 0 | $D_{60}$ | $D_{64}$ | $D_{68}$ | $D_{72}$ | $D_{76}$ |
| $D_2$ | $D_6$ | $D_{11}$ | $D_{17}$ | $D_{23}$ | $D_{29}$ | $D_{35}$ | 0 | 0 | $C_{2B}$ | 0 | 0 | $D_{65}$ | $D_{69}$ | $D_{73}$ | $D_{77}$ |
| $D_3$ | $D_7$ | $D_{11}$ | $D_{16}$ | $D_{22}$ | $D_{28}$ | $D_{34}$ | $D_{40}$ | 0 | 0 | $C_{3A}$ | 0 | 0 | $D_{70}$ | $D_{74}$ | $D_{78}$ |
| $D_4$ | $D_8$ | $D_{12}$ | $D_{16}$ | $D_{21}$ | $D_{27}$ | $D_{33}$ | $D_{39}$ | $D_{45}$ | 0 | 0 | $C_{4B}$ | 0 | 0 | $D_{75}$ | $D_{79}$ |
| $D_5$ | $D_9$ | $D_{13}$ | $D_{17}$ | $D_{21}$ | $D_{26}$ | $D_{32}$ | $D_{38}$ | $D_{44}$ | $D_{50}$ | 0 | 0 | $C_{5A}$ | 0 | 0 | $D_{80}$ |
| 0 | $D_{10}$ | $D_{14}$ | $D_{18}$ | $D_{22}$ | $D_{26}$ | $D_{31}$ | $D_{37}$ | $D_{43}$ | $D_{49}$ | $D_{55}$ | 0 | 0 | $C_{6B}$ | 0 | 0 |
| 0 | 0 | $D_{15}$ | $D_{19}$ | $D_{23}$ | $D_{27}$ | $D_{31}$ | $D_{36}$ | $D_{42}$ | $D_{48}$ | $D_{54}$ | $D_{60}$ | 0 | 0 | $C_{7A}$ | 0 |
| $C_{8A}$ | 0 | 0 | $D_{20}$ | $D_{24}$ | $D_{28}$ | $D_{32}$ | $D_{36}$ | $D_{41}$ | $D_{47}$ | $D_{53}$ | $D_{59}$ | $D_{65}$ | 0 | 0 | $C_{8B}$ |
| 0 | $C_{9B}$ | 0 | 0 | $D_{25}$ | $D_{29}$ | $D_{33}$ | $D_{37}$ | $D_{41}$ | $D_{46}$ | $D_{52}$ | $D_{58}$ | $D_{64}$ | $D_{70}$ | 0 | 0 |
| 0 | 0 | $C_{10A}$ | 0 | 0 | $D_{30}$ | $D_{34}$ | $D_{38}$ | $D_{42}$ | $D_{46}$ | $D_{51}$ | $D_{57}$ | $D_{63}$ | $D_{69}$ | $D_{75}$ | 0 |
| $D_5$ | 0 | 0 | $C_{11B}$ | 0 | 0 | $D_{35}$ | $D_{39}$ | $D_{43}$ | $D_{47}$ | $D_{51}$ | $D_{56}$ | $D_{62}$ | $D_{68}$ | $D_{74}$ | $D_{80}$ |
| $D_4$ | $D_{10}$ | 0 | 0 | $C_{12A}$ | 0 | 0 | $D_{40}$ | $D_{44}$ | $D_{48}$ | $D_{52}$ | $D_{56}$ | $D_{61}$ | $D_{67}$ | $D_{73}$ | $D_{79}$ |
| $D_3$ | $D_9$ | $D_{15}$ | 0 | 0 | $C_{13B}$ | 0 | 0 | $D_{45}$ | $D_{49}$ | $D_{53}$ | $D_{57}$ | $D_{61}$ | $D_{66}$ | $D_{72}$ | $D_{78}$ |
| $D_2$ | $D_8$ | $D_{14}$ | $D_{20}$ | 0 | 0 | $C_{14A}$ | 0 | 0 | $D_{50}$ | $D_{54}$ | $D_{58}$ | $D_{62}$ | $D_{66}$ | $D_{71}$ | $D_{77}$ |
| $D_1$ | $D_7$ | $D_{13}$ | $D_{19}$ | $D_{25}$ | 0 | 0 | $C_{15B}$ | 0 | 0 | $D_{55}$ | $D_{59}$ | $D_{63}$ | $D_{67}$ | $D_{71}$ | $D_{76}$ |

Note: $C_{NX}$ = Phase X Modulo Two Sum Of The Nth Row Data Bits

Etc.

An Alternate Code Arrangement
For Burst Error Correction

Maximum Error Burst Length
= # Data Bits + Check Bit Per Column + 1

| $D_1-D_5$ | $C_{8A}$ | $D_6-D_{10}$ | $C_{9B}$ | $D_{11}-D_{15}$ | $C_{10A}$ | $D_{16}-D_{20}$ | $C_{11B}$ |

| $D_{21}-D_{25}$ | $C_{12A}$ | $D_{26}-D_{30}$ | $C_{13B}$ | $D_{31}-D_{35}$ | $C_{14A}$ | $D_{36}-D_{40}$ | $C_{15B}$ |

| $D_{41}-D_{45}$ | $C_{1A}$ | $D_{46}-D_{50}$ | $C_{2B}$ | $D_{51}-D_{55}$ | $C_{3A}$ | $D_{56}-D_{60}$ | $C_{4B}$ |

| $D_{61}-D_{65}$ | $C_{5A}$ | $D_{66}-D_{70}$ | $C_{6B}$ | $D_{71}-D_{75}$ | $C_{7A}$ | $D_{76}-D_{80}$ | $C_{8B}$ |

| $D_{81}-D_{85}$ | $C_{9A}$ | $D_{86}-D_{90}$ | $C_{10B}$ | $D_{91}-D_{95}$ | $C_{11A}$ | $D_{96}-D_{100}$ | $C_{12B}$ |

| $D_{101}-D_{105}$ | $C_{13A}$ | $D_{106}-D_{110}$ | $C_{14B}$ | $D_{111}-D_{115}$ | $C_{15A}$ | $D_{116}-D_{120}$ | $C_{1B}$ |

| $D_{121}-D_{125}$ | $C_{2A}$ | $D_{126}-D_{130}$ | $C_{3B}$ | $D_{131}-D_{135}$ | $C_{4A}$ | $D_{136}-D_{140}$ | $C_{5B}$ |

| $D_{141}-D_{145}$ | $C_{6A}$ | $D_{146}-D_{150}$ | $C_{7B}$ | $D_{151}-D_{155}$ | $C_{8A}$ | ● ● ●

FIG. 9

Transmission Sequence For The
Alternate Code Interleaving
Arrangement For Burst Error Correction

FIG. 10

| | | | | | | | | | | | | | |
|---|---|---|---|---|---|---|---|---|---|---|---|---|---|
| $D_1$ | $D_6$ | $D_{12}$ | $D_{18}$ | $D_{24}$ | $D_{30}$ | 0 | 0 | $C_1$ | 0 | 0 | $D_{60}$ | $D_{64}$ | $D_{68}$ | $D_{72}$ |
| $D_2$ | $D_6$ | $D_{11}$ | $D_{17}$ | $D_{23}$ | $D_{29}$ | $D_{35}$ | 0 | 0 | $C_2$ | 0 | 0 | $D_{65}$ | $D_{69}$ | $D_{73}$ |
| $D_3$ | $D_7$ | $D_{11}$ | $D_{16}$ | $D_{22}$ | $D_{28}$ | $D_{34}$ | $D_{40}$ | 0 | 0 | $C_3$ | 0 | 0 | $D_{70}$ | $D_{74}$ |
| $D_4$ | $D_8$ | $D_{12}$ | $D_{16}$ | $D_{21}$ | $D_{27}$ | $D_{33}$ | $D_{39}$ | $D_{45}$ | 0 | 0 | $C_4$ | 0 | 0 | $D_{75}$ |
| $D_5$ | $D_9$ | $D_{13}$ | $D_{17}$ | $D_{21}$ | $D_{26}$ | $D_{32}$ | $D_{38}$ | $D_{44}$ | $D_{50}$ | 0 | 0 | $C_5$ | 0 | 0 |
| 0 | $D_{10}$ | $D_{14}$ | $D_{18}$ | $D_{22}$ | $D_{26}$ | $D_{31}$ | $D_{37}$ | $D_{43}$ | $D_{49}$ | $D_{55}$ | 0 | 0 | $C_6$ | 0 |
| 0 | 0 | $D_{15}$ | $D_{19}$ | $D_{23}$ | $D_{27}$ | $D_{31}$ | $D_{36}$ | $D_{42}$ | $D_{48}$ | $D_{54}$ | $D_{60}$ | 0 | 0 | $C_7$ |
| $C_8$ | 0 | 0 | $D_{20}$ | $D_{24}$ | $D_{28}$ | $D_{32}$ | $D_{36}$ | $D_{41}$ | $D_{47}$ | $D_{53}$ | $D_{59}$ | $D_{65}$ | 0 | 0 |
| 0 | $C_9$ | 0 | 0 | $D_{25}$ | $D_{29}$ | $D_{33}$ | $D_{37}$ | $D_{41}$ | $D_{46}$ | $D_{52}$ | $D_{58}$ | $D_{64}$ | $D_{70}$ | 0 |
| 0 | 0 | $C_{10}$ | 0 | 0 | $D_{30}$ | $D_{34}$ | $D_{38}$ | $D_{42}$ | $D_{46}$ | $D_{51}$ | $D_{57}$ | $D_{63}$ | $D_{69}$ | $D_{75}$ |
| $D_5$ | 0 | 0 | $C_{11}$ | 0 | 0 | $D_{35}$ | $D_{39}$ | $D_{43}$ | $D_{47}$ | $D_{51}$ | $D_{56}$ | $D_{62}$ | $D_{68}$ | $D_{74}$ |
| $D_4$ | $D_{10}$ | 0 | 0 | $C_{12}$ | 0 | 0 | $D_{40}$ | $D_{44}$ | $D_{48}$ | $D_{52}$ | $D_{56}$ | $D_{61}$ | $D_{67}$ | $D_{73}$ |
| $D_3$ | $D_9$ | $D_{15}$ | 0 | 0 | $C_{13}$ | 0 | 0 | $D_{45}$ | $D_{49}$ | $D_{53}$ | $D_{57}$ | $D_{61}$ | $D_{66}$ | $D_{72}$ |
| $D_2$ | $D_8$ | $D_{14}$ | $D_{20}$ | 0 | 0 | $C_{14}$ | 0 | 0 | $D_{50}$ | $D_{54}$ | $D_{58}$ | $D_{62}$ | $D_{66}$ | $D_{71}$ |
| $D_1$ | $D_7$ | $D_{13}$ | $D_{19}$ | $D_{25}$ | 0 | 0 | $C_{15}$ | 0 | 0 | $D_{55}$ | $D_{59}$ | $D_{63}$ | $D_{67}$ | $D_{71}$ |

Note: $C_N$ = Modulo Two Sum Of The Nth Row Data Bits

Part 1 Code Arrangement
For Multiple Burst Error Correction

FIG. 11

| | | | | | | | | | | | | | | |
|---|---|---|---|---|---|---|---|---|---|---|---|---|---|---|
| $D_1$ | $D_7$ | $D_{13}$ | $D_{19}$ | $D_{25}$ | 0 | 0 | $C_1$ | 0 | 0 | $D_{55}$ | $D_{59}$ | $D_{63}$ | $D_{67}$ | $D_{71}$ |
| $D_1$ | $D_6$ | $D_{12}$ | $D_{18}$ | $D_{24}$ | $D_{30}$ | 0 | 0 | $C_2$ | 0 | 0 | $D_{60}$ | $D_{64}$ | $D_{68}$ | $D_{72}$ |
| $D_2$ | $D_6$ | $D_{11}$ | $D_{17}$ | $D_{23}$ | $D_{29}$ | $D_{35}$ | 0 | 0 | $C_3$ | 0 | 0 | $D_{65}$ | $D_{69}$ | $D_{73}$ |
| $D_3$ | $D_7$ | $D_{11}$ | $D_{16}$ | $D_{22}$ | $D_{28}$ | $D_{34}$ | $D_{40}$ | 0 | 0 | $C_4$ | 0 | 0 | $D_{70}$ | $D_{74}$ |
| $D_4$ | $D_8$ | $D_{12}$ | $D_{16}$ | $D_{21}$ | $D_{27}$ | $D_{33}$ | $D_{39}$ | $D_{45}$ | 0 | 0 | $C_5$ | 0 | 0 | $D_{75}$ |
| $D_5$ | $D_9$ | $D_{13}$ | $D_{17}$ | $D_{21}$ | $D_{26}$ | $D_{32}$ | $D_{38}$ | $D_{44}$ | $D_{50}$ | 0 | 0 | $C_6$ | 0 | 0 |
| 0 | $D_{10}$ | $D_{14}$ | $D_{18}$ | $D_{22}$ | $D_{26}$ | $D_{31}$ | $D_{37}$ | $D_{43}$ | $D_{49}$ | $D_{55}$ | 0 | 0 | $C_7$ | 0 |
| 0 | 0 | $D_{15}$ | $D_{19}$ | $D_{23}$ | $D_{27}$ | $D_{31}$ | $D_{36}$ | $D_{42}$ | $D_{48}$ | $D_{54}$ | $D_{60}$ | 0 | 0 | $C_8$ |
| $C_9$ | 0 | 0 | $D_{20}$ | $D_{24}$ | $D_{28}$ | $D_{32}$ | $D_{36}$ | $D_{41}$ | $D_{47}$ | $D_{53}$ | $D_{59}$ | $D_{65}$ | 0 | 0 |
| 0 | $C_{10}$ | 0 | 0 | $D_{25}$ | $D_{29}$ | $D_{33}$ | $D_{37}$ | $D_{41}$ | $D_{46}$ | $D_{52}$ | $D_{58}$ | $D_{64}$ | $D_{70}$ | 0 |
| 0 | 0 | $C_{11}$ | 0 | 0 | $D_{30}$ | $D_{34}$ | $D_{38}$ | $D_{42}$ | $D_{46}$ | $D_{51}$ | $D_{57}$ | $D_{63}$ | $D_{69}$ | $D_{75}$ |
| $D_5$ | 0 | 0 | $C_{12}$ | 0 | 0 | $D_{35}$ | $D_{39}$ | $D_{43}$ | $D_{47}$ | $D_{51}$ | $D_{56}$ | $D_{62}$ | $D_{68}$ | $D_{74}$ |
| $D_4$ | $D_{10}$ | 0 | 0 | $C_{13}$ | 0 | 0 | $D_{40}$ | $D_{44}$ | $D_{48}$ | $D_{52}$ | $D_{56}$ | $D_{61}$ | $D_{67}$ | $D_{73}$ |
| $D_3$ | $D_9$ | $D_{15}$ | 0 | 0 | $C_{14}$ | 0 | 0 | $D_{45}$ | $D_{49}$ | $D_{53}$ | $D_{57}$ | $D_{61}$ | $D_{66}$ | $D_{72}$ |
| $D_2$ | $D_8$ | $D_{14}$ | $D_{20}$ | 0 | 0 | $C_{15}$ | 0 | 0 | $D_{50}$ | $D_{54}$ | $D_{58}$ | $D_{62}$ | $D_{66}$ | $D_{71}$ |

Note: $C_N$ = Modulo Two Sum Of The Nth Row Data Bits

Part 2 Code Arrangement
For Multiple Burst Error Correction

FIG. 12

| $D_2$ | $D_8$ | $D_{14}$ | $D_{20}$ | 0 | 0 | $C_1$ | 0 | 0 | $D_{50}$ | $D_{54}$ | $D_{58}$ | $D_{62}$ | $D_{66}$ | $D_{71}$ |
|---|---|---|---|---|---|---|---|---|---|---|---|---|---|---|
| $D_1$ | $D_7$ | $D_{13}$ | $D_{19}$ | $D_{25}$ | 0 | 0 | $C_2$ | 0 | 0 | $D_{55}$ | $D_{59}$ | $D_{63}$ | $D_{67}$ | $D_{71}$ |
| $D_1$ | $D_6$ | $D_{12}$ | $D_{18}$ | $D_{24}$ | $D_{30}$ | 0 | 0 | $C_3$ | 0 | 0 | $D_{60}$ | $D_{64}$ | $D_{68}$ | $D_{72}$ |
| $D_2$ | $D_6$ | $D_{11}$ | $D_{17}$ | $D_{23}$ | $D_{29}$ | $D_{35}$ | 0 | 0 | $C_4$ | 0 | 0 | $D_{65}$ | $D_{69}$ | $D_{73}$ |
| $D_3$ | $D_7$ | $D_{11}$ | $D_{16}$ | $D_{22}$ | $D_{28}$ | $D_{34}$ | $D_{40}$ | 0 | 0 | $C_5$ | 0 | 0 | $D_{70}$ | $D_{74}$ |
| $D_4$ | $D_8$ | $D_{12}$ | $D_{16}$ | $D_{21}$ | $D_{27}$ | $D_{33}$ | $D_{39}$ | $D_{45}$ | 0 | 0 | $C_6$ | 0 | 0 | $D_{75}$ |
| $D_5$ | $D_9$ | $D_{13}$ | $D_{17}$ | $D_{21}$ | $D_{26}$ | $D_{32}$ | $D_{38}$ | $D_{44}$ | $D_{50}$ | 0 | 0 | $C_7$ | 0 | 0 |
| 0 | $D_{10}$ | $D_{14}$ | $D_{18}$ | $D_{22}$ | $D_{26}$ | $D_{31}$ | $D_{37}$ | $D_{43}$ | $D_{49}$ | $D_{55}$ | 0 | 0 | $C_8$ | 0 |
| 0 | 0 | $D_{15}$ | $D_{19}$ | $D_{23}$ | $D_{27}$ | $D_{31}$ | $D_{36}$ | $D_{42}$ | $D_{48}$ | $D_{54}$ | $D_{60}$ | 0 | 0 | $C_9$ |
| $C_{10}$ | 0 | 0 | $D_{20}$ | $D_{24}$ | $D_{28}$ | $D_{32}$ | $D_{36}$ | $D_{41}$ | $D_{47}$ | $D_{53}$ | $D_{59}$ | $D_{65}$ | 0 | 0 |
| 0 | $C_{11}$ | 0 | 0 | $D_{25}$ | $D_{29}$ | $D_{33}$ | $D_{37}$ | $D_{41}$ | $D_{46}$ | $D_{52}$ | $D_{58}$ | $D_{64}$ | $D_{70}$ | 0 |
| 0 | 0 | $C_{12}$ | 0 | 0 | $D_{30}$ | $D_{34}$ | $D_{38}$ | $D_{42}$ | $D_{46}$ | $D_{51}$ | $D_{57}$ | $D_{63}$ | $D_{69}$ | $D_{75}$ |
| $D_5$ | 0 | 0 | $C_{13}$ | 0 | 0 | $D_{35}$ | $D_{39}$ | $D_{43}$ | $D_{47}$ | $D_{51}$ | $D_{56}$ | $D_{62}$ | $D_{68}$ | $D_{74}$ |
| $D_4$ | $D_{10}$ | 0 | 0 | $C_{14}$ | 0 | 0 | $D_{40}$ | $D_{44}$ | $D_{48}$ | $D_{52}$ | $D_{56}$ | $D_{61}$ | $D_{67}$ | $D_{73}$ |
| $D_3$ | $D_9$ | $D_{15}$ | 0 | 0 | $C_{15}$ | 0 | 0 | $D_{45}$ | $D_{49}$ | $D_{53}$ | $D_{57}$ | $D_{61}$ | $D_{66}$ | $D_{72}$ |

Note: $C_N$ = Modulo Two Sum Of The Nth Row Data Bits

Part 3 Code Arrangement
For Multiple Burst Error Correction

| | | | | | | | | | | | | | | | |
|---|---|---|---|---|---|---|---|---|---|---|---|---|---|---|---|
| | $D_2$ | $D_8$ | $D_{14}$ | $D_{20}$ | 0 | 0 | $C_{31X}$ $C_{31Z}$ | 0 | 0 | $D_{50}$ | $D_{54}$ | $D_{58}$ | $D_{62}$ | $D_{66}$ | $D_{72}$ |
| $D_1$ | $D_7$ | $D_{13}$ | $D_{19}$ | $D_{25}$ | 0 | 0 | $C_{21X}$ $C_{21Z}$ | 0 | 0 | $D_{55}$ | $D_{59}$ | $D_{63}$ | $D_{67}$ | $D_{71}$ | $D_{71}$ |
| $D_1$ | $D_6$ | $D_{12}$ | $D_{18}$ | $D_{24}$ | $D_{30}$ | 0 | 0 | $C_{11X}$ $C_{11Z}$ | 0 | 0 | $D_{60}$ | $D_{64}$ | $D_{68}$ | $D_{72}$ | $D_{72}$ | $D_{72}$ |
| $D_2$ | $D_6$ | $D_{11}$ | $D_{17}$ | $D_{23}$ | $D_{29}$ | $D_{35}$ | 0 | 0 | $C_{12X}$ $C_{12Z}$ | 0 | 0 | $D_{65}$ | $D_{69}$ | $D_{73}$ | $D_{73}$ | $D_{73}$ |
| $D_3$ | $D_7$ | $D_{11}$ | $D_{16}$ | $D_{22}$ | $D_{28}$ | $D_{34}$ | $D_{40}$ | 0 | 0 | $C_{13X}$ $C_{13Z}$ | 0 | 0 | $D_{70}$ | $D_{74}$ | $D_{74}$ | $D_{74}$ |
| $D_4$ | $D_8$ | $D_{12}$ | $D_{16}$ | $D_{21}$ | $D_{27}$ | $D_{33}$ | $D_{39}$ | $D_{45}$ | 0 | 0 | $C_{14X}$ $C_{14Z}$ | 0 | 0 | $D_{75}$ | $D_{75}$ | $D_{75}$ |
| $D_5$ | $D_9$ | $D_{13}$ | $D_{17}$ | $D_{21}$ | $D_{26}$ | $D_{32}$ | $D_{38}$ | $D_{44}$ | $D_{50}$ | 0 | 0 | $C_{15X}$ $C_{15Z}$ | 0 | 0 | 0 | 0 |
| 0 | $D_{10}$ | $D_{14}$ | $D_{18}$ | $D_{22}$ | $D_{26}$ | $D_{31}$ | $D_{37}$ | $D_{43}$ | $D_{49}$ | $D_{55}$ | 0 | 0 | $C_{16X}$ $C_{16Z}$ | 0 | 0 | 0 |
| 0 | 0 | $D_{15}$ | $D_{19}$ | $D_{23}$ | $D_{27}$ | $D_{31}$ | $D_{36}$ | $D_{42}$ | $D_{48}$ | $D_{54}$ | $D_{60}$ | 0 | 0 | $C_{17X}$ $C_{17Z}$ | $C_{27X}$ $C_{27Z}$ | $C_{37X}$ $C_{37Z}$ |
| $C_{18X}$ $C_{18Z}$ | 0 | 0 | $D_{20}$ | $D_{24}$ | $D_{28}$ | $D_{32}$ | $D_{36}$ | $D_{41}$ | $D_{47}$ | $D_{53}$ | $D_{59}$ | $D_{65}$ | 0 | 0 | 0 | 0 |
| 0 | $C_{19X}$ $C_{19Z}$ | 0 | 0 | $D_{25}$ | $D_{29}$ | $D_{33}$ | $D_{37}$ | $D_{41}$ | $D_{46}$ | $D_{52}$ | $D_{58}$ | $D_{64}$ | $D_{70}$ | 0 | 0 | 0 |
| 0 | 0 | $C_{110X}$ $C_{110Z}$ | 0 | 0 | $D_{30}$ | $D_{34}$ | $D_{38}$ | $D_{42}$ | $D_{46}$ | $D_{51}$ | $D_{57}$ | $D_{63}$ | $D_{69}$ | $D_{75}$ | $D_{75}$ | $D_{75}$ |
| $D_5$ | 0 | 0 | $C_{111X}$ $C_{111Z}$ | 0 | 0 | $D_{35}$ | $D_{39}$ | $D_{43}$ | $D_{47}$ | $D_{51}$ | $D_{56}$ | $D_{62}$ | $D_{68}$ | $D_{74}$ | $D_{74}$ | $D_{74}$ |
| $D_4$ | $D_{10}$ | 0 | 0 | $C_{112X}$ $C_{112Z}$ | 0 | 0 | $D_{40}$ | $D_{44}$ | $D_{48}$ | $D_{52}$ | $D_{56}$ | $D_{61}$ | $D_{67}$ | $D_{73}$ | $D_{73}$ | $D_{73}$ |
| $D_3$ | $D_9$ | $D_{15}$ | 0 | 0 | $C_{113X}$ $C_{113Z}$ | 0 | 0 | $D_{45}$ | $D_{49}$ | $D_{53}$ | $D_{57}$ | $D_{61}$ | $D_{66}$ | $D_{72}$ | $D_{72}$ | $D_{72}$ |
| $D_2$ | $D_8$ | $D_{14}$ | $D_{20}$ | 0 | 0 | $C_{114X}$ $C_{114Z}$ | 0 | 0 | $D_{50}$ | $D_{54}$ | $D_{58}$ | $D_{62}$ | $D_{66}$ | $D_{71}$ | $D_{71}$ | |
| $D_1$ | $D_7$ | $D_{13}$ | $D_{19}$ | $D_{25}$ | 0 | 0 | $C_{115X}$ $C_{115Z}$ | 0 | 0 | $D_{55}$ | $D_{59}$ | $D_{63}$ | $D_{67}$ | $D_{71}$ | | |

Note: $C_{LNX}$ = Modulo Two Sum Of The Nth Row Data Bits In The X Dimension Of The Lth Part

Combined Parts Of Code Arrangements For Multiple Burst Error Correction

FIG. 13

Note: $C_{LNX}$ = Modulo Two Sum Of The Nth Row Data Bits In The X Dimension Of The Lth Part Computation Of The Two Dimensions Of Check Bits For The
Combined Parts Of Code Arrangements
For Multiple Burst Error Correction

| | | | | | | | | | |
|---|---|---|---|---|---|---|---|---|---|
| $D_1 - D_5$ | $C_{18X}$ / $C_{18Z}$ | $D_6 - D_{10}$ | $C_{19X}$ / $C_{19Z}$ | $D_{11} - D_{15}$ | $C_{110X}$ / $C_{110Z}$ | $D_{16} - D_{20}$ | $C_{111X}$ / $C_{111Z}$ |
| $D_{21} - D_{25}$ | $C_{112X}$ / $C_{112Z}$ | $D_{26} - D_{30}$ | $C_{113X}$ / $C_{113Z}$ | $D_{31} - D_{35}$ | $C_{114X}$ / $C_{114Z}$ | $D_{36} - D_{40}$ | $C_{115X}$ / $C_{115Z}$ |
| $D_{41} - D_{45}$ | $C_{11X}$ / $C_{11Z}$ | $D_{46} - D_{50}$ | $C_{12X}$ / $C_{12Z}$ | $D_{51} - D_{55}$ | $C_{13X}$ / $C_{13Z}$ | $D_{56} - D_{60}$ | $C_{14X}$ / $C_{14Z}$ |
| $D_{61} - D_{65}$ | $C_{15X}$ / $C_{15Z}$ | $D_{66} - D_{70}$ | $C_{16X}$ / $C_{16Z}$ | $D_{71} - D_{75}$ | $C_{17X}$ / $C_{17Z}$ | $D_1 - D_5$ | $C_{28X}$ / $C_{28Z}$ |
| $D_6 - D_{10}$ | $C_{29X}$ / $C_{29Z}$ | $D_{11} - D_{15}$ | $C_{210X}$ / $C_{210Z}$ | $D_{16} - D_{20}$ | $C_{211X}$ / $C_{211Z}$ | $D_{21} - D_{25}$ | $C_{212X}$ / $C_{212Z}$ |
| $D_{26} - D_{30}$ | $C_{213X}$ / $C_{213Z}$ | $D_{31} - D_{35}$ | $C_{214X}$ / $C_{214Z}$ | $D_{36} - D_{40}$ | $C_{215X}$ / $C_{215Z}$ | $D_{41} - D_{45}$ | $C_{21X}$ / $C_{21Z}$ |
| $D_{46} - D_{50}$ | $C_{22X}$ / $C_{22Z}$ | $D_{51} - D_{55}$ | $C_{23X}$ / $C_{23Z}$ | $D_{56} - D_{60}$ | $C_{24X}$ / $C_{24Z}$ | $D_{61} - D_{65}$ | $C_{25X}$ / $C_{25Z}$ |
| $D_{66} - D_{70}$ | $C_{26X}$ / $C_{26Z}$ | $D_{71} - D_{75}$ | $C_{27X}$ / $C_{27Z}$ | $D_1 - D_5$ | $C_{38X}$ / $C_{38Z}$ | $D_6 - D_{10}$ | $C_{39X}$ / $C_{39Z}$ |
| $D_{11} - D_{15}$ | $C_{310X}$ / $C_{310Z}$ | • • • | | | | | |

Note: $C_{LNX}$ = Modulo Two Sum Of The Nth Row Data Bits In The X Dimension Of The Lth Part Transmission Sequence For The
Combined Parts Of The Code Arrangement
For Multiple Burst Error Correction
FIG. 15

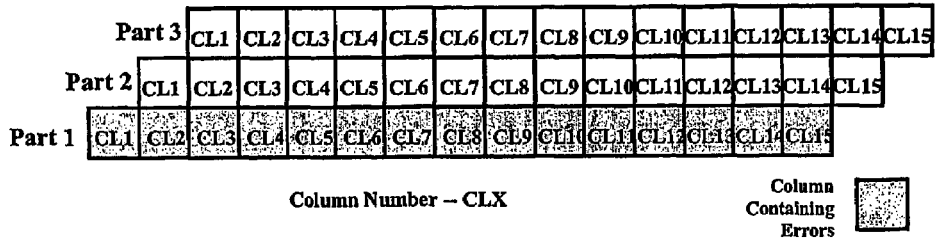

FIG. 16A – Correctable Burst Error Covering Multiple Columns In One Part

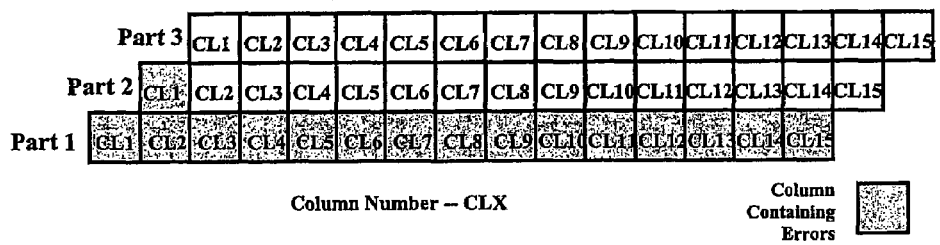

FIG. 16B – Correctable Burst Error Covering Multiple Columns In More Than One Part

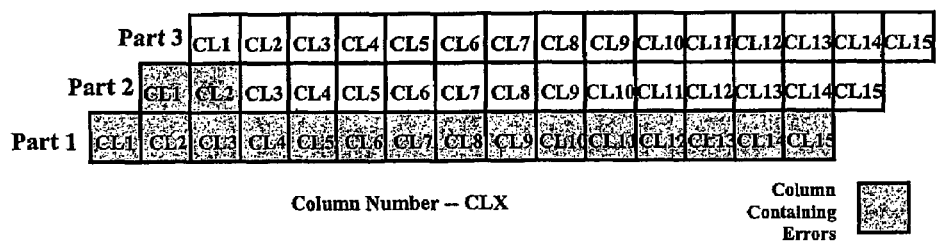

FIG. 16C – Uncorrectable Burst Error Covering Multiple Columns In More Than One Part

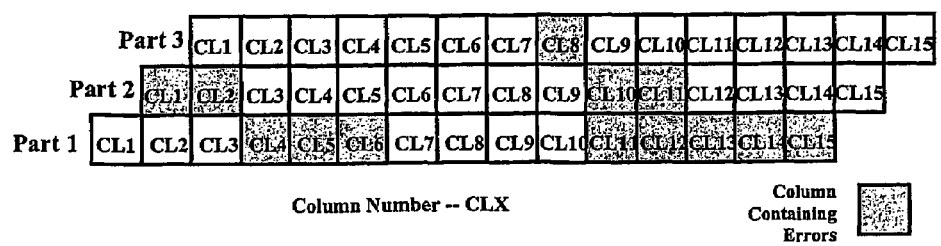

FIG. 16D – Example Of Multiple Correctable Burst Errors

Illustrations Of The Effect Of The Occurrence Of Multiple Burst Errors During The Transmission Of The Bits In The Cubic Code Arrangement

FIG. 17

Cubic Code Arrangement
For Multiple Burst Error Correction

Typical Stage of the Encoder Processing Logic

SYSTEM AND METHOD FOR FORWARD ERROR CORRECTION

CROSS-REFERENCE TO RELATED APPLICATION

The present application claims priority to U.S. Provisional Application No. 60/364,894, entitled "System and Method for Adaptable Forward Error Correction," filed Mar. 14, 2002, the contents of which are hereby incorporated herein in their entirety by reference.

FIELD OF THE INVENTION

The present invention is directed to systems and methods for performing forward error correction, including adaptable forward error correction.

BACKGROUND OF THE INVENTION

U.S. Pat. No. 3,562,709 issued Feb. 9, 1971 to C. V. Srinivasan, is directed to the correction of block errors in transmission of data. In Srinivasan, the matrix used to describe the mathematics for the code arithmetic corresponds to an arrangement similar to that given in the FIG. 1. The principal difference between the Srinivasan matrix and the matrix of FIG. 1, is that the Srinivasan matrix only used one zero on each side of the check bit to separate it from the two arrangements of the data bits. Such an arrangement will work as a block error encoder and a block error detector, locator and corrector. However, this arrangement, suffers from at least two drawbacks. First, under some conditions, errors occurring simultaneously in two blocks can be misinterpreted as a group of errors in a third, totally different, block. Second, under other conditions, errors occurring simultaneously in two blocks can be misinterpreted as a situation where no errors are present at all.

Additional arrangements, where the additional zeros are interspersed within the set of data bits (while preserving the mirror image arrangement of the Srinivasan patent), have been shown to have equally good error detection, location and correction characteristics. Other new arrangements have also been shown to allow the construction of sets of matrices that have some particular total of data bits, such as $2^N$.

In the previous work described above, the mirror image arrangement of the data bits in a column was used. Also, there was never a case where anything other than a regular arrangement of the check bits into positions in the matrix was described. That is, the check bit in the first column of the matrix was assigned to some element such as the first, the middle or the last and the check bits of subsequent columns were always arranged in a linear fashion going up or down (with a wrap-around included as necessary) for the remaining columns.

U.S. Pat. No. 5,751,740 issued on May 12, 1998 to W. A. Helbig, Sr., corrects the two limitations of the Srinivasan patent by using a matrix arrangement where there are two zeros on each side of the check bit in each column. The Srinivasan patent also shows an identical number of data bits in each column of the matrix while the Helbig '740 patent shows that columns in the matrix may contain differing numbers of data bits with additional zeros used to separate the check bit of a column from the two images of the data bits in the column.

The code matrix shown in FIG. 1 has been constructed according to the teaching of the Helbig '740 patent. In this case, there are five data bits, numbered $D_1$ through $D_5$, that have been placed respectively in the first five element spaces, numbers one through five, of the first column of the matrix. In the next two element spaces, numbers six and seven, are each assigned the value zero. The next element space, number eight, is reserved for the eighth check bit, designated as $C_8$, that will be calculated as the modulo-two sum of the data bits that are put into the eighth element spaces of the other columns of the matrix. In the next two element spaces, numbers nine and ten, are also each assigned the value zero. The last five element spaces, numbered eleven through fifteen, are assigned, in reverse order, the values of the five data bits, numbered $D_1$ through $D_5$, that have been placed respectively in the first five element spaces, numbers one through five, of the first column of the matrix as shown.

Referring still to FIG. 1, the subsequent columns of the matrix are constructed in a similar manner. The difference being, as taught in the Helbig '740 patent, that each subsequent column is circularly shifted by one row from the previous column.

When the placing of the entire group of data bits into the matrix is completed and all of the respective check bits have been calculated and placed into the matrix the information is transmitted. The information is sent by transmitting all of the data bits of the first column, numbered $D_1$ through $D_5$, and the Check Bit, numbered $C_8$, of the first column as a block of bits. This is followed by the transmission of the remaining blocks of data bits and check bit of the other columns of the matrix until all of the information has been sent.

Upon receipt of the information the error syndrome bits are calculated using the information received. If the error syndrome bits indicate that there are one or more errors in one of the blocks of bits received the information is corrected using the error syndrome bits. The Helbig '740 patent contains the equations for determining whether one or more errors are present in a column and how to fix the errors if such exist. However, if errors are found in more than one of the blocks of bits received the errors cannot be corrected.

SUMMARY OF THE INVENTION

The present invention addresses the shortcoming of existing systems, and provides for the correction of multiple errors in cases where errors are found in more than one of the blocks of the received bits.

More particularly, the present invention is directed to a system and method of transmitting a plurality of data bits over a transmission channel. A plurality of data bits are arranged into a plurality of matrices, each of the plurality of matrices having a plurality of blocks, wherein the plurality of data bits are arranged into the plurality of blocks. The plurality of matrices are arranged into a cube having a first dimension and a second dimension, the first dimension relating to one of the plurality of matrices, and the second dimension relating to multiple ones of the plurality of matrices. A set of check bits are generated for each of the plurality of blocks in the matrices. Each set of check bits includes a first check bit and a second check bit wherein the first check bit relates to the first dimension of the cube and the second check bit relates to the second dimension of said cube. One or more of the cubes are transmitted across a transmission channel and received at a decoder. The decoder detects and corrects one or more errors in data bits of cubes received at the decoder in accordance with the check bits.

BRIEF DESCRIPTION OF THE DRAWINGS

The accompanying drawings, which are incorporated herein and constitute part of this specification, illustrate the presently preferred embodiment of the invention, and, together with the general description given above and the detailed description given below, serve to explain features of the invention.

FIG. 1 illustrates a matrix used for implementing a forward error correction system, in accordance with the prior art.

FIG. 2 illustrates a further matrix that can be used for implementing a forward error correction system, in accordance with the present invention.

FIG. 3 illustrates a further matrix that can be used for implementing a forward error correction system, in accordance with the present invention.

FIG. 4 illustrates a further matrix that can be used for implementing a forward error correction system, in accordance with the present invention.

FIGS. 5 and 6 illustrate further matrices that can be used together for implementing a forward error correction system, in accordance with the present invention.

FIG. 7 depicts the order of transmission for the matrices shown in FIGS. 5 and 6, in accordance with the present invention.

FIG. 8 illustrates a further matrix that can be used for implementing a forward error correction system, in accordance with the present invention.

FIG. 9 depicts the order of transmission for the matrix shown in FIG. 8, in accordance with the present invention.

FIG. 10 illustrates a "Part 1" matrix used for implementing a forward error correction system, in accordance with the present invention.

FIG. 11 illustrates a further matrix that can be used for implementing a forward error correction system, in accordance with the present invention.

FIG. 12 illustrates a further matrix that can be used for implementing a forward error correction system, in accordance with the present invention.

FIG. 13 illustrates a cube of data bits formed by combining the matrices of FIGS. 10, 11, 12, along with 12 further similarly constructed matrices, in accordance with the present invention.

FIG. 15 depicts the order of transmission for the cube of data shown in FIG. 13, in accordance with the present invention.

FIG. 16A depicts a correctable burst error covering multiple columns in one part, in accordance with the present invention.

FIG. 16B depicts a correctable burst error covering multiple columns in more than one part, in accordance with the present invention.

FIG. 16C depicts an uncorrectable burst error covering multiple columns in more than one part, in accordance with the present invention.

FIG. 16D depicts an example of multiple correctable burst errors, in accordance with the present invention.

FIG. 17 is a further illustration of the cube shown in FIG. 13, in accordance with the present invention.

Throughout the figures, unless otherwise stated, the same reference numerals and characters denote like features, elements, components, or portions of the illustrated embodiments.

DETAILED DESCRIPTION OF THE PREFERRED EMBODIMENT

Figure 14:
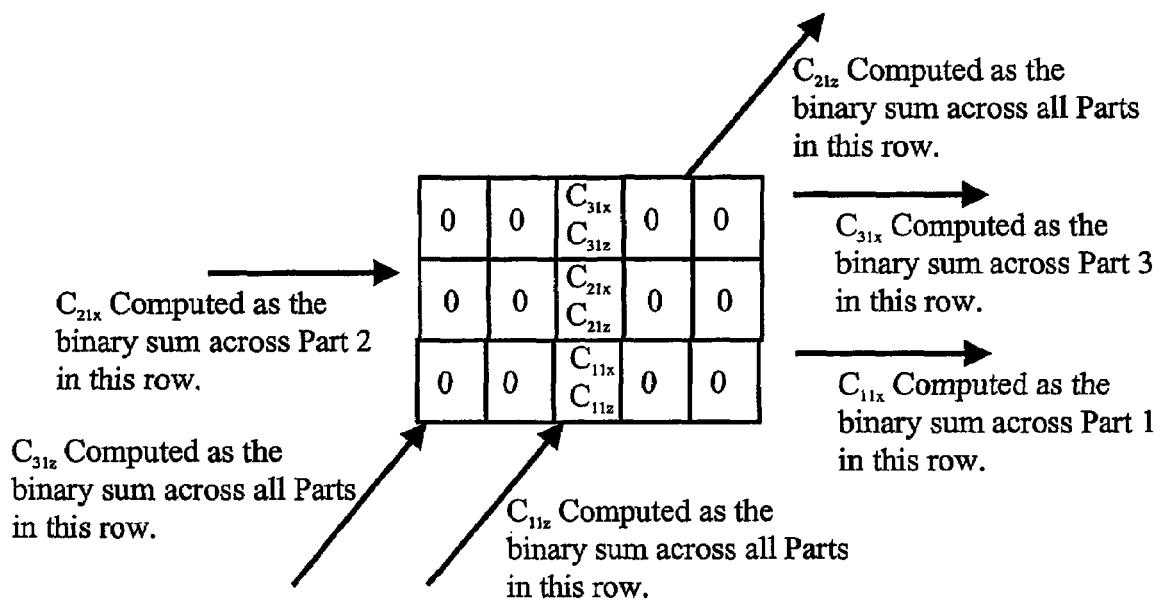
FIG. 14 is a diagram illustrating the method for computing check bits for the cube of data bits of FIG. 13, in accordance with the present invention.

Although the Helbig '740 patent contains the equations for determining whether one or more errors are present in a column and how to fix the errors if such exist, questions remain as to why this arrangement shown in the Helbig '740 patent works and are there any other arrangements that work. No known mathematical analysis has been performed on this methodology to prove that this arrangement will always work. However, by examination and by trial and error certain facts about this technique have been discovered. One is that, for this arrangement, the two numbers of column elements between the two copies of each data bit are unique for all data bits. That is:

A. Between the two $D_1$ data bits there are zero elements in one direction and thirteen elements in the other direction, B. Between the two $D_2$ data bits there are two elements in one direction and eleven elements in the other direction, C. Between the two $D_3$ data bits there are four elements in one direction and nine elements in the other direction, D. Between the two $D_4$ data bits there are six elements in one direction and seven elements in the other direction, and E. Between the two $D_5$ data bits there are eight elements in one direction and five elements in the other direction.

It can also be seen that this unique arrangement will always prevent the two copies of one data bit from ever being in positions that correspond to the two copies of any of the other data bits in the matrix.

The arrangement of the data bits and the check bits into the matrix as shown in the FIG. 1 is not the only arrangement that can be used to construct the matrix. For example, the arrangement in FIG. 2 could also be used. However, upon close examination it can be seen that all of the check bit generation equations are the same for FIG. 1 and FIG. 2. This is easily seen to be true and the reason is that the FIG. 2 arrangement is one where the elements of all columns of the matrix are simply circularly shifted vertically by one bit position (and the same will be true for any other number of bit positions up to fourteen). It can also be easily seen that the same sort of thing will be true if the elements of the rows in the matrix are circularly shifted one bit position (or more up to fourteen bit positions) to the right or the left. This latter version simply changes the subscripts of the data bits associated with the check bit in a particular row as the columns are moved around. That is done so that, if the first column is always filled with the first data bits that arrive at the encoder and so forth the data bits have the proper notations.

Referring now to FIG. 3, there is shown an arrangement of the data bits and check bits into a matrix that is different from the others so far discussed. However, it can easily be seen that the FIG. 3 matrix will preserve the error correction capabilities of the FIG. 1 arrangement by simply noting that there is one and only one check bit in each column and in each row of the matrix. In fact, from this it can be seen that any arrangement that preserves these properties and keeps the arrangements of the data bits in the columns so that the elements in all columns are palindromes (as they are in FIGS. 1 and 2) will provide similar error correction characteristics.

FIG. 4 illustrates a further matrix that can be used for implementing a forward error correction system, in accordance with the present invention. What can be seen from an examination of this figure is that it appears to be true that if any other positions of the data bits are used where the uniqueness of the distances between the two instances of each given data bit is preserved the same properties for error correction will also be preserved. Such an arrangement can be constructed by applying a circular shift to the data bits on one side of the column. For example, if a circular shift of three bits is applied to the bottom data bits in the group position assignments, as shown in FIG. 4, the distances between the two copies of the data bits then become as follows:

A. Between the two $D_1$ data bits there are three elements in one direction and ten elements in the other direction, B. Between the two $D_2$ data bits there are five elements in one direction and eight elements in the other direction, C. Between the two $D_3$ data bits there are two elements in one direction and eleven elements in the other direction, D. Between the two $D_4$ data bits there are four elements in one direction and nine elements in the other direction, and E. Between the two $D_5$ data bits there are six elements in one direction and seven elements in the other direction.

The same holds true for one, two and four bits of circular shift as well.

FIGS. 5 and 6 illustrate further matrices that can be used together for implementing a forward error correction system, in accordance with the present invention. In this case, the first set of data bits received are put into the first column of the first of two matrices that are used for the first of two sets of calculations used with this arrangement. Hence the check bit is designated $C_{8,A}$. (See FIG. 5.) The next set of data bits received are put into the first column of the second of two matrices that are used for the second of two sets of calculations used with this arrangement. Hence the check bit is designated $C_{8,B}$. (See FIG. 6.) This arrangement is continued until the entire matrices of FIGS. 5 and 6 are completed by the calculation of all of the check bits of the two matrices. When the information in the two matrices are transmitted the data bits and the check bit of the first column of the first matrix (FIG. 5) are sent first (as is shown in FIG. 7). The data bits and the check bit of the first column of the second matrix (FIG. 6) are sent next (as is also shown in FIG. 7). This process is then continued, as is diagrammed in FIG. 7, until all of the bits, both data bits and check bits, are sent.

Using the illustration on FIG. 7, it can be seen that, if a burst of errors whose length in bits is no more than one greater than the number of bits (data and check bit) in one column of one matrix the error burst can fall anywhere in the sequence of sending the bits without affecting any of the bits of either matrix except those in one, and only one, column. (If either of the matrices contains different numbers of data bits in its various columns then this number must be equal to the smallest number of bits in any column of either matrix.) This condition is such that, using the error location and correction equations given in the Helbig '740 patent, all of the bits in error can be corrected.

This arrangement of FIGS. 5-7 can be used for a larger number of matrices if protection from a larger burst of errors is to be achieved. Whatever number of matrices is used the maximum error burst length, in bits, that can be corrected will be equal to one bit plus a number of bits that is equal to one less than the number of matrices used multiplied by the number of bits (data and check bit) in each column of the matrices. If the matrices contain differing numbers of data bits in their various columns then this product will be equal to the smallest sum of the number of bits in each set of columns from the matrices that are sent contiguously.

FIG. 8 illustrates a further matrix that can be used for implementing a forward error correction system, in accordance with the present invention. In this arrangement the data bits first received are put into the first column of a matrix that is twice as wide as it is tall. The next data bits are then put into the second column of this matrix as shown, and so forth until the matrix is full. The check bits are then calculated using the information in every other column for one set of equations and the information in the other columns for the second set of calculations.

The data and check bits of the expanded width matrix in FIG. 8 are then transmitted as shown in FIG. 9. This arrangement then produces the same capability for correcting a burst of errors as the arrangement given in FIGS. 5-7, with the following exceptions:

A. The number of columns of the matrix must be an integer multiple of the number of rows in the matrix, and B. None of the factors of the number of rows in the matrix (except 1) shall also be a factor of the integer specified in exception A.

The reason for this is simply that these arrangements do not preserve the condition that there be one and only one check bit in each column and in each row of each of the matrices that are interleaved in this manner. For example, if there were fifteen rows in each matrix that is to be interleaved in this manner and the number of matrices to be interleaved is either three or five the "one and only one check bit in each column and in each row" rule would not followed. For the three matrices case the first check bit of the first matrix would be in row eight as shown. The second check bit for this matrix would then appear in row eleven, the next in row fourteen, the next in row two, the next in row five and the next in row eight thus violating the rule.

FIGS. 1-9 are directed to code and matrix arrangements that can be used for block error correction and for single burst error correction. The attributes of these arrangements are such that there is no theoretical limit to the size of the matrices and, therefore, the size of the block of errors that can be detected, located and corrected. With some of the transmission interleaving arrangements described above, there is no theoretical limit to the size of the burst of errors that can be detected, located and corrected. The limitation with the arrangements described thus far is that only one block of errors can be detected, located and corrected for each matrix and only one burst of errors can be detected, located and corrected for each group of matrices used to make up an EDAC frame. An EDAC Frame consists of those data bits and check bits that are combined by either interleaving or concatenation to produce the burst error detection, location and correction capability desired. If there are K data bits in each column of each matrix, the block size is K+1 bits and there are 2*N+5 blocks in a matrix. If L matrices are combined to provide burst error detection, location and correction capability, then the maximum burst error length that can be detected, located and corrected is equal to (L−1)*(K+1)+1 bits.

When the embodiments of FIGS. 1-9 are used for burst data transmission, a single EDAC Frame is sent during each transmission burst. When the embodiments of FIGS. 1-9 are used for continuous data transmission or for long burst data transmission, multiple EDAC Frames are concatenated and sent as a single entity. In the first case, a single error burst can be detected, located and corrected during each burst of transmission. For the latter case, one error burst can be detected, located and corrected in each EDAC Frame transmitted during each burst of transmission.

The remainder of this disclosure describes an arrangement whereby multiple matrices can be combined into a single EDAC Frame to achieve the capability to detect, locate and correct a collection of multiple bursts of errors that occur in a single EDAC Frame. The description below is directed to the single case of a two dimensional arrangement of blocks of bits. From this, an extension to the three dimensional case (as well as extensions to larger dimensions) will be understood by those skilled in the art.

Referring now to FIGS. 10-11, there is shown a further matrices that can be used for implementing a forward error correction system, in accordance with the present invention. The "Part 1" matrix of FIG. 10 is the same as the matrix of FIG. 1 discussed above. The "Part 2" matrix of FIG. 11 is constructed so that the check bits in the columns are in positions that correspond to the next successive positions for check bits in the same columns in the "Part 1" matrix of FIG. 10. That is, for example, the check bit in the first column of the FIG. 10 matrix is in row eight while the check bit in the first column in the FIG. 11 matrix is in row nine. Thus, the FIG. 11 matrix corresponds to the FIG. 10 matrix with a circular vertical shift down of one element position (with the appropriate wrap-around).

FIG. 12 illustrates a further matrix that can be used for implementing a forward error correction system, in accordance with the present invention. This matrix is constructed so that the check bits in the columns are in positions that correspond to the next successive positions for check bits in the same columns in the matrix shown in FIG. 11. That is, for example, the check bit in the first column of the FIG. 11 matrix is in row nine while the check bit in the first column in the FIG. 12 matrix is in row ten. Thus, the FIG. 12 matrix corresponds to the FIG. 11 matrix with a circular vertical shift down of one element position (with the appropriate wrap-around).

Twelve other matrices are also constructed in the same manner as the matrices of FIGS. 11 and 12, such that each successive matrix includes a further vertical shift down of one element position (with the appropriate wrap-around).

FIG. 13 illustrates a cube of data bits formed by combining the matrices of FIGS. 10, 11, 12, along with the 12 farther similarly constructed matrices, in accordance with the present invention.

FIG. 14 is a diagram illustrating the method for computing check bits for the cube of data bits of FIG. 13, in accordance with the present invention. For this arrangement, two check bit values are computed for each column of each part. One value is calculated to be the modulo-two sum of the data bits in the check bit's row of the cube in the X dimension as shown. The other value is calculated to be the modulo-two sum of the data bits in the check bit's row of the cube in the Z dimension as shown. That is, for example:

A. $C_{18X}=D_{20} \oplus D_{24} \oplus D_{28} \oplus D_{32} \oplus D_{36} \oplus D_{41} \oplus D_{47} \oplus D_{53} \oplus D_{59} \oplus D_{65}$, and B. $C_{18Z}=D_5$ [From the $4^{th}$ Part]$\oplus$
  $D_4$ [From the $5^{th}$ Part]$\oplus$
  $D_3$ [From the $6^{th}$ Part]$\oplus$
  $D_2$ [From the $7^{th}$ Part]$\oplus$
  $D_1$ [From the $8^{th}$ Part]$\oplus$
  $D_1$ [From the $9^{th}$ Part]$\oplus$
  $D_2$ [From the $10^{th}$ Part]$\oplus$
  $D_3$ [From the $11^{th}$ Part]$\oplus$
  $D_4$ [From the $12^{th}$ Part]$\oplus$
  $D_5$ [From the $13^{th}$ Part].

FIG. 15 depicts the order of transmission for the cube of data shown in FIG. 14, in accordance with the present invention. As shown in the figure, all of the bits; data and both check bits, of the first column of the Part 1 matrix are transmitted first. This is followed by the transmission of all of the bits; data and both check bits, of the second column of the Part 1 matrix. This sequence is then followed until all of the bits; data and both check bits, of all of the columns of the Part 1 matrix are transmitted. An identical sequence is then followed to transmit all of the bits; data and check bits, of the entire Part 2 matrix. This sequence is then followed until all of the fifteen parts of the cube are transmitted. It should be noted that the bits; data and check bits, of the cube can, as an alternate approach, be transmitted using a sequence that transmits, one right after the other, all of the bits; data and check bits, of the first column of all of the fifteen parts of the cube. In both cases, the multiple burst error correction capabilities of the cubic arrangement are the same.

FIGS. 16A-D illustrate how errors are handled in connection with the transmission of the cube of data bits described above. FIG. 16A illustrates a single burst of errors that occurs while the bits; data and check bits, of the Part 1 matrix are being transmitted. For each block of bits that contain errors, detection, location and correction will result from the processing of the data and check bits in the Z dimension. Therefore, the burst of errors can cover the entire Part 1 matrix and still be corrected. It will also be understood that the errors of the burst can wrap around the end of the Part 1 matrix and on to the beginning of the Part 2 matrix, while not affecting the same columns of both the Part 1 and the Part 2 matrices and still be corrected through the processing of the data and check bits in the Z dimension.

Further, as illustrated in FIG. 16B, it will also be understood that the errors of the burst can wrap around the end of the Part 1 matrix and on to the beginning of the Part 2 matrix, and affect only one of the same columns of both the Part 1 and the Part 2 matrices and still be corrected through the processing of the data and check bits in first the Z dimension and then in the X dimension. In this case, processing the data and check bits in the Z dimension first will eliminate all of the errors in columns two through fifteen of the Part 1 matrix leaving only errors in columns one of both the Part 1 and Part 2 matrices. Then, processing the data and check bits in the X dimension will eliminate all of the errors in these two columns of both the Part 1 and the Part 2 matrices.

As illustrated in FIG. 16C, if the error bursts affect two or more of the same columns of two or more of the fifteen parts of the cube, these errors cannot be corrected using the two dimensional arrangement for the check bits. In this case, when the data and check bits are processed in the Z dimension, both of the equation sets for these two columns will both indicate the presence of an uncorrectable error condition. Then, when the data and check bits are processed in the X dimension the corresponding two parts of the cube will both still indicate the presence of an uncorrectable error condition because the first error correction processing did not remove enough errors to reduce the number of columns affected by the errors to one or none for these parts of the cube.

FIG. 16D illustrates one example where multiple bursts of errors can occur in the data of the cube and still be corrected. In this case, when the data and check bits are processed in the Z dimension, all of the errors numbered one, two, four, five, six, eight, ten, twelve thirteen, fourteen, and fifteen will be corrected. Then when the data and check bits are processed in the X dimension, the corresponding two parts of the cube will both still indicate the presence of errors in column eleven because the first error correction processing did not remove these errors. However, both of the second set of error correction processes will, for Part 1 and Part 2 of the cube, indicate that the errors present can be corrected and will do so.

Referring to the Code arrangement for correcting multiple error bursts that was described previously in described in connection with FIGS. 8-14 above, it was stated that the check bits for each block (each column in the Z direction of each plane in the X and Y dimensions) of the cube are computed both in the X dimension and in the Y dimension using the formulae described. The computations for the direction corresponding to the direction that data comes into the Encoder are performed in the same manner they would be if only one matrix (one plane) was being encoded. These computations can be performed as the data comes into the Encoder with the full set of check bits fully computed almost immediately after the last column's data arrives at the Encoder. The same follows true for all of the columns in the same dimension.

Figure 17:
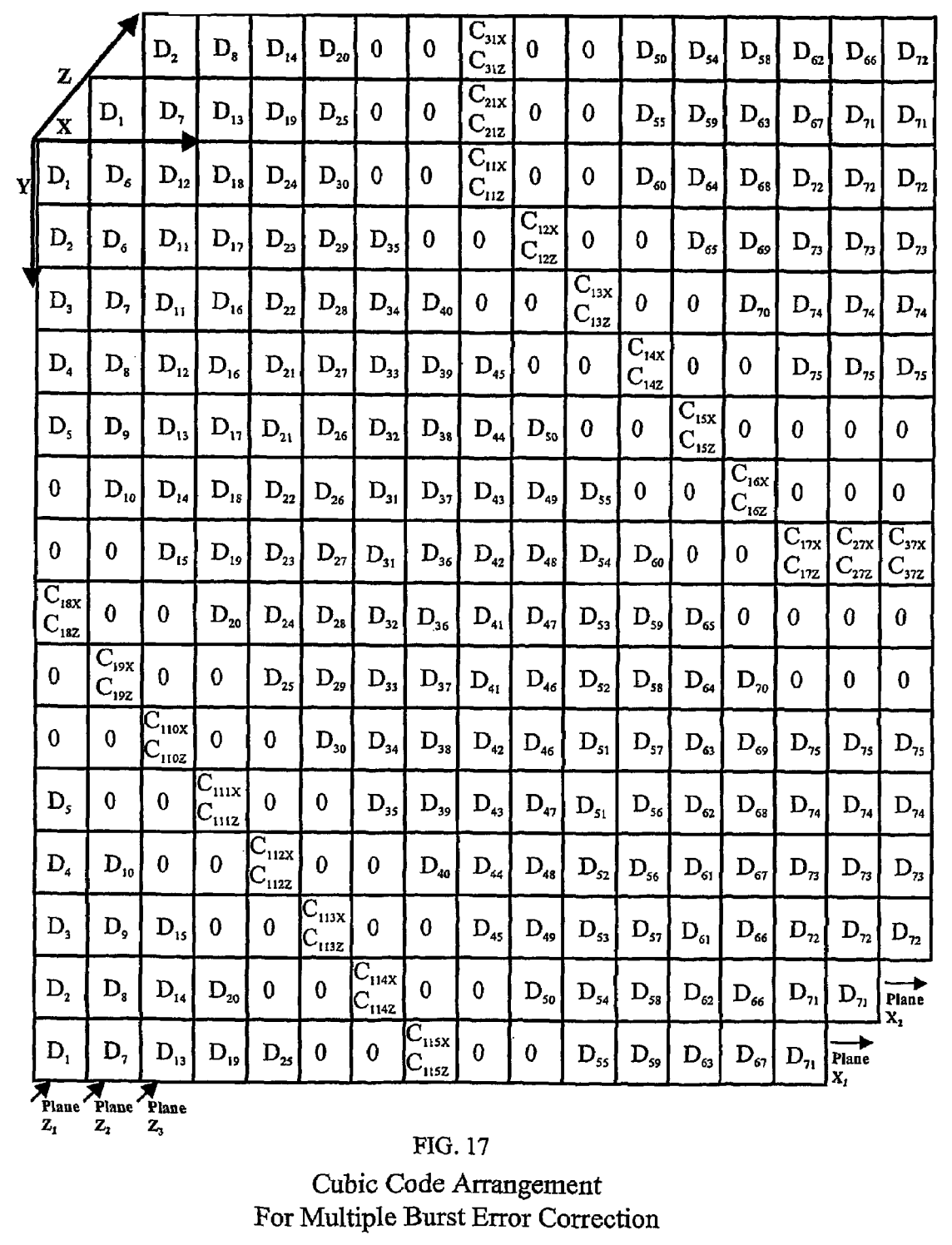
Figure 18:
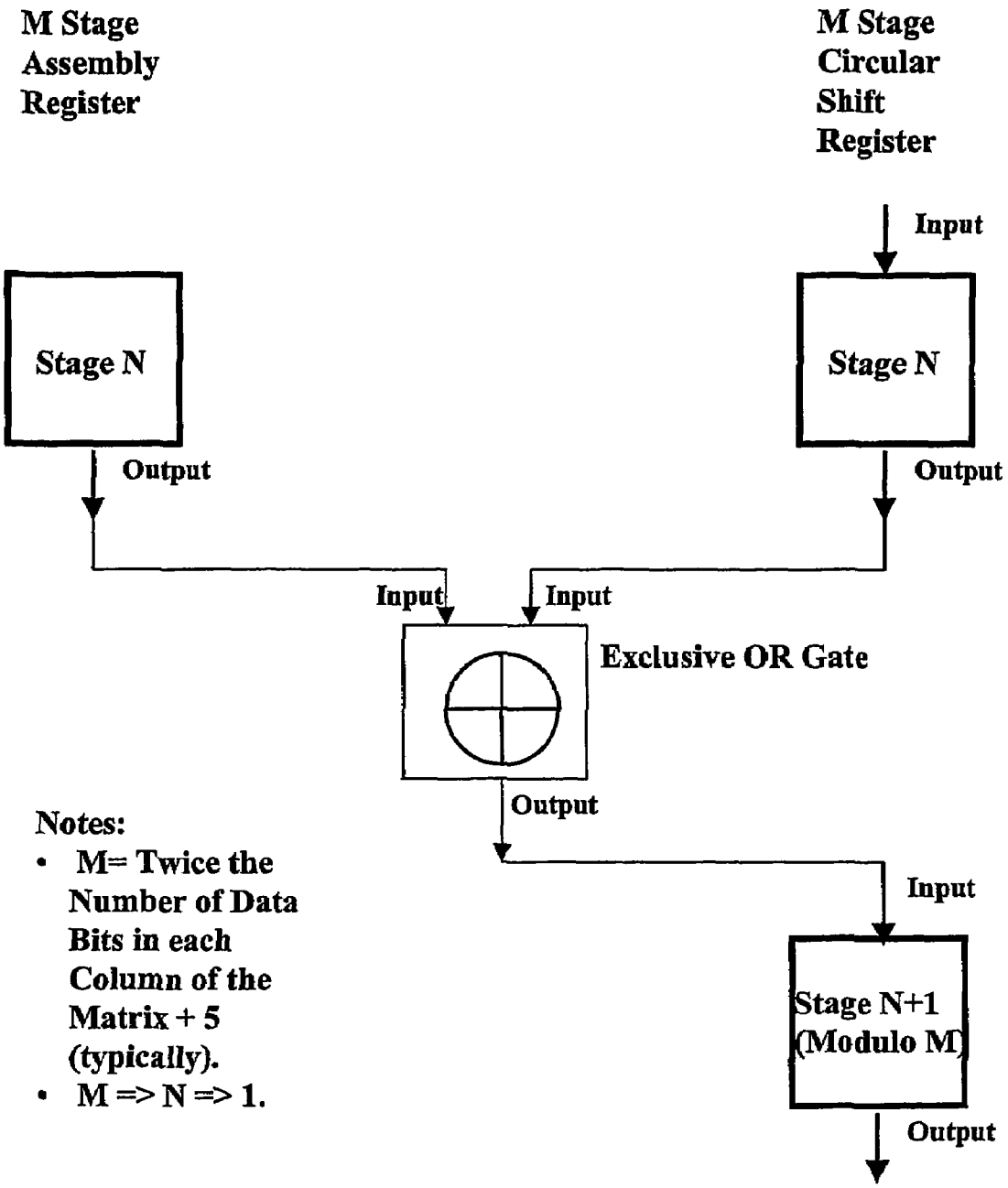
FIG. 18 illustrates an exemplary encoder for generating the cube of FIG. 17, in accordance with the present invention.

As shown in FIG. 18, the implementation approach for performing these encoding computations can be constructed using two registers. The first register is an Assembly Register that has the same number of stages as there are entries in the columns of the cube (illustrated in FIG. 17.) The input data is loaded in this register in the same manner as is diagrammed in the previous figures; i.e., two copies of each data bit are put into the Assembly Register in what can be the "mirror image arrangement" illustrated in FIG. 1 or in any of the other arrangements illustrated in the other figures. The second register is a Circular Shift Register with the same number of stages as the Assembly Register. Connecting the two registers together is a set of Exclusive OR gates with each having, as one of its two inputs, the output from one of the stages of the Assembly Register and, as the other of its two inputs, the output from the corresponding stage of the Circular Shift Register. The output of each of the Exclusive OR gates is connected to the input of the next successive stage of the Circular Shift Register as illustrated in FIG. 18.

After each set of M input data bits for each column of the X dimension plane is put into the Assembly Register, its values are Exclusively ORed with the previous contents of the Circular Shift Register as illustrated in FIG. 18 and the data bits that were put into the block of the matrix that makes up the X dimension plane the data bits are stored into the proper location(s) of the Encoder's Data Memory. After all of the M sets of data bits in turn are put into the Assembly Register, Exclusively ORed with the previous contents of the Circular Shift Register as shown, and then stored into the appropriate locations of the Encoder's Data Memory, the final contents of the Circular Shift Register are also stored into the appropriate location(s) of the Encoder's Data Memory and the Circular Shift Register is then cleared (i.e., set to all zeros).

To encode the data (generate the check bits) for the Z planes the logic needed is exactly the same as that previously described. In fact, only one Assembly Register is required because the functions of the Assembly Register are the same for both sets of encoding operations. For the X plane computations, the Circular Shift Register retains its contents as each of the M sets of data bits are assembled and processed and only after all of the M sets of data bits are processed are the contents of the Circular Shift Register stored in the Encoder's Data Memory and the Circular Shift Register is cleared of the contents just stored. For the Z plane computations, the interim contents for the computations of the Z plane (that is, the contents presently in the Circular Shift Register) are stored into the appropriate location(s) of the Encoder's Data Memory after each block of data (i.e., column of the matrix) is processed and the Circular Shift Register is loaded with the interim contents of the computations being performed for the next successive Z plane from the appropriate location(s) of the Encoder's Data Memory. This process can be diagrammed as set forth in Table I below:

For the First X Plane:

Step 1:
For the first X plane: Matrix Column #1 $\oplus$ 0→Circular Shift Register (Shifted by one bit position).
For the first Z plane: Matrix Column #1 $\oplus$ 0→First set of Z plane Encoder Data Memory locations.

Step 2:
For the first X plane: Matrix Column #2 $\oplus$ Circular Shift Register contents→Circular Shift Register (Shifted by one bit position).
For the second Z plane: Matrix Column #2 $\oplus$ 0→Second set of Z plane Encoder Data Memory locations.

Steps R=3 Through M-1:
For the first X plane: Matrix Column #R $\oplus$ Circular Shift Register contents→Circular Shift Register (Shifted by one bit position).
For the $R^{TH}$ Z plane: Matrix Column #R $\oplus$0<$R^{TH}$ set of Z plane Encoder Data Memory locations.

Step M:
For the X plane: Matrix Column #M $\oplus$ Circular Shift Register contents→First set of X plane Encoder Data Memory locations (Shifted by one bit position).
For the Z plane: Matrix Column #R $\oplus$ 0→$M^{TH}$ set of Z plane Encoder Data Memory locations.

For the Second X Plane:

Step 1:
For the second X plane: Matrix Column #1 $\oplus$0→Circular Shift Register (Shifted by one bit position).
For the first Z plane: Matrix Column #2 $\oplus$ Previous contents of the first set of Z plane Encoder Data Memory locations→First set of Z plane Encoder Data Memory locations.

Step 2:
For the second X plane: Matrix Column #2 $\oplus$0→Circular Shift Register (Shifted by one bit position).
For the second Z plane: Matrix Column #2 $\oplus$ Previous contents of the second set of Z plane Encoder Data Memory locations→Second set of Y plane Encoder Data Memory locations.

ETC.

TABLE I

After an area of the Encoder's Data Memory is filled with the data and check bits for one EDAC cube, another area is then used to assembly the data and check bits for the next sequential EDAC cube. While the Encoder is generating the check bits for this next EDAC cube, the data and check bits for the previously assembled EDAC cube can be transmitted. By virtue of the system clocks being properly set, the area of the Encoder's Data Memory that holds the data and check bits for the previously assembled EDAC cube will be emptied at the same time the area of the Encoder's Data Memory that holds the data and check bits for the EDAC cube being assembled is filled. Thus, only two Encoder Data Memory areas are needed for the system to run continually. This will produce a latency for the Encoder that is equal to one EDAC frame time.

With further analysis it can be shown that while the Encoder logic is handling data for the $M^{TH}$ X plane of an EDAC cube the data and check bits for the $1^{ST}$ X plane for the previously assembled data and check bits for this EDAC cube can be transmitted. This will produce a latency for the Encoder that is slightly less than one EDAC frame time.

When the data and check bits for an assembled EDAC cube are transmitted it does not matter whether the transmission sequence sends the data and check bits for each X plane in sequence or sends the data and check bits for each Z plane in sequence. Both arrangements, because of the use of two-dimensional check bit encoding, will have the same error detection, location and correction properties.

When data is transmitted using the order of sending all of the columns of data and check bits from the first X plane before sending any other data and check bits, this is followed by sending all of the columns of data and check bits of the second X plane. This is then followed by sending all of the columns of data and check bits of the remaining X planes in order.

With this arrangement, whenever an error burst occurs it will affect the data and check bits of one or more columns that are transmitted adjacent to each other. Often this will result in the processing of the received data and check bits for the X plane determining that the data is not recoverable. This is because more than one block of the matrix that is the X plane contains errors. However, it will be understood that, even in the extreme case shown in FIG. 16A, that all of the errors will be corrected when the data and check bits are processed in the Z planes.

Even if the error burst covers the of data and check bits shown in FIG. 16B, the errors in the first X plane cannot be corrected by the X plane processing. Further, all of the errors of the first X plane cannot be corrected by the Y plane processing because there are errors in both the first columns of the first and second X planes. However, the errors in the first column of the second X plane will be corrected when the X plane processing is performed for this second X plane leaving just the errors in the first column of the first X plane for the Z plane processing to clear up; which it will do.

From this it is easy to see that the errors in the first two columns of the first two X planes, as shown in FIG. 16C, cannot be corrected even with the processing performed in two dimensions. Processing in the Z plane direction will correct all of the errors in all of the columns of the first X plane from the third column on but it will leave double error conditions for both of the first and second columns of the first and second X planes. In fact, with this case it doesn't matter if the processing is done in the X plane direction first and then in the Z plane direction or vice versa. The results will still be the same. The conclusion is then that the maximum burst error length cannot be any longer than the length of one plane or such an uncorrectable error situation will likely arise.

If the error situation is as illustrated in FIG. 16D, processing first in the X plane dimension will get rid of the errors in the $8^{TH}$ column of the $3^{RD}$ X plane. Subsequent processing in the Y plane dimension will get rid of the errors in the $4^{TH}$, $5^{TH}$, $6^{TH}$, $12^{TH}$, $13^{TH}$, $14^{TH}$ and $15^{TH}$ columns of the first X plane and the $1^{ST}$, $2^{ND}$ and $10^{TH}$ columns of the $2^{ND}$ X plane. What will remain will be the errors in the $11^{TH}$ columns of both the $1^{ST}$ and the $2^{ND}$ X planes, which, by the way, would both be removed by an additional cycle of X plane processing.

It is not as easy to construct an example where a second round of processing would be required in both the X plane and in the Z plane dimensions to remove the final errors after the first sequence of X plane processing and then Z plane processing is completed. Further, it would seem to be possible to construct an example where a third round of processing cycles would be required to remove the errors remaining after the first two rounds of processing have been completed. It can be seen, by the difficulty to construct such examples, that the error combinations will have to fall in very specific locations relative to each other meaning that the probability of such cases occurring will be very low. In fact, the probability will become lower as the difficulty to construct such cases grows.

In the examples discussed so far, the processing is said to be first performed in the X plane dimension. This is the dimension in which the data and check bits are said to be transmitted. This is also the dimension in which multiple columns will be in error if the error burst covers more than one column of data and check bits. However, it is also the dimension where the error processing can be done while the data and check bits are being received. Therefore, doing the processing in the same plane dimension as the dimension used for transmitting the data and check bits will require a processing latency of just one EDAC frame time to achieve. While, on the other hand; doing the first processing of the data and check bits in the plane dimension opposite to the dimension used for transmitting the data and check bits will require two EDAC frame times to achieve.

From an implementation standpoint, doing the processing in the same plane dimension as the dimension used for transmitting the data and check bits will require less hardware because the Decoder/Error-Locator/Error-Corrector Data Memory control system will be much simpler that that required for doing the processing in the opposite dimension as the dimension used for transmitting the data and check bits.

From these illustrations it appears that the multiple burst error processing should occur first in the Z dimension and then in the X dimension. If similar illustrations are constructed for multiple burst error conditions that could occur if the alternate transmission sequence described in connection with FIG. 15 above were used, it would appear that the best error processing would occur first in the X dimension and then in the Z dimension. This indicates that the first set of error correction processes should occur in the opposite dimension from the one used to govern the data transmission sequence.

However, if other illustrations are constructed it is easy to show that this isn't necessarily true. What can be easily shown is that the best way to process the received data to correct for multiple error bursts is to process the received data in the dimension opposite the one used for the transmission sequence, then process the remaining data in the other dimension, and then do both of these sets of processing over again. There are many arrangements of the errors in the matrices that can be corrected in this manner when they could not be corrected with the two processing cycle approach.

The four processing cycle approach will undoubtedly be more expensive to implement than the two processing cycle approach. Further, since the inherent error rate of the transmission channel is likely to be fairly low, implementing the four cycle error correction approach will likely prove to be totally uneconomical. Therefore, the four cycle error correction approach is not recommended.

It should also be noted that even greater error detection, location and correction capabilities can be obtained by expanding the coding of the data using three or more dimensions of check bits. Here as well, just because the mathematical processes can be formulated, it doesn't mean that it is a viable solution that should be used. With just the two dimension encoding and the two dimensions of error detection, location and correction processing used, the probability of having an uncorrectable error condition occur will be so low that it will be extremely expensive to try to do something other than detect the uncorrectable error condition and then ask for a re-transmission of the data in the cube.

Finally, it is expected that the percentage of error situations that will occur that can be directly handled by these two choices of processing sequences will be about the same.

Therefore, since the sequence of first doing the processing in the same plane dimension as the dimension used for transmitting the data and check bits will be less expensive, this arrangement is the preferred one. On the other hand, if the extra latency will not be a problem it may just be, because a single IC implementation of the Decoder/Error-Locator/Error-Corrector unit will not be expensive, that two of the Decoder/Error-Locator/Error-Corrector units in series will be the most popular choice.

Figure 19:
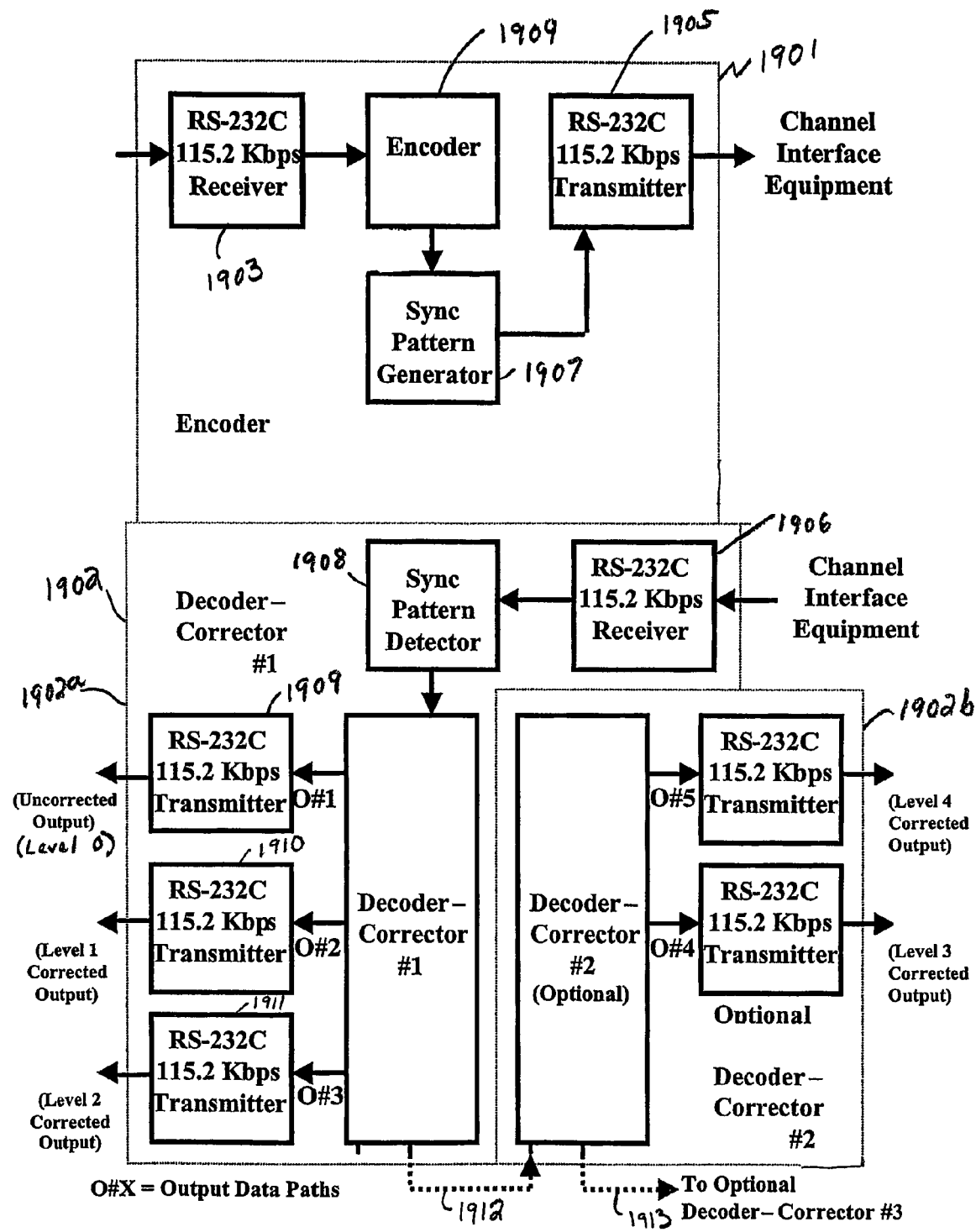
FIG. 19 illustrates a system for encoding and decoding data in accordance with the present invention.

FIG. 19 illustrates a system for encoding and decoding data in accordance with the present invention. As shown in FIG. 19, the system consists of two sections: an Encoder 1901 and a Decoder-Corrector 1902. Encoder 1902 applies an encoding algorithm as described above in connection with FIGS. 8-18 to data that is provided by a generating source to receiver 1903. The encoding process is performed using encoder 1904, and generates two sets of redundancy bits that are combined with the input data to produce the encoded data. The encoded data is then sent via transmitter 1905 to the input interface for a communication channel, which conveys the encoded data to a selected terminal site. At the terminal site, the communication channel's output interface is used to transfer the received encoded information to the Decoder-Corrector unit 1902 via receiver 1906. The Decoder-Corrector 1902 is formed of at least one decoder-corrector 1902a, and optionally further decoder-corrector units such as unit 1902b. The Decoder-Corrector unit 1902 applies a decoding algorithm as described in above in connection with FIGS. 8-18 to the data that has been sent to it from the communication channel output interface. After the Decoder-Corrector 1902 processes the received data, the recovered encoded data is then reformatted back into the same format used by the generating source and sent to the input interface for a user unit.

A synchronization pattern generator logic unit 1907 interrupts the flow of the encoded data from the Encoder unit 1901 to the communication channel in order to insert the transmission of a synchronization pattern. This pattern is conveyed to a synchronization pattern detector logic unit 1908 that accompanies the Decoder-Corrector 1902 to insure that the operations of the Encoder 1901 and the Decoder-Corrector 1902 are synchronized so that proper error detecting, locating and correcting operations may be performed on the data received at the output of the communication channel.

Decoder-Corrector Unit 1902 provides four levels of outputs. The first level of processing (Level 0) performed on the received bits is one that simply removes both levels of overhead bits, reformats the data bits that remain back into the format in which they were received and then transmits the result over an RS-232C output channel via transmitter. When the channel error insertion rate is low, perhaps less than $10^{-5}$, this output can, and should be, used because it has the least processing latency of all of the system outputs, approximately 0.01 second. As the channel error insertion rate increases, up to about $10^3$, the first level (Level 1) of EDAC processing capability should be used. This will reduce the residue of errors to something less than $10^{-7}$ at the expense of an increased latency, to approximately 0.11 second. As the channel error insertion rate increases to a severe value, up to about $5*10^{-2}$, the second EDAC processing capability (Level 2) can be applied to the results of the first EDAC processing level. Again the result will be a reduction of the residual errors to something less than $10^{-7}$. The combined processing latency, however, will increase to be on the order of 5.06 seconds.

For each processing level there is a separate RS-232C output channel. In all cases the redundant bits are removed and the data bits are reformatted back to that used for the input. Internal to the Decoder-Corrector Unit 1902, errors in both the data and redundant bits are corrected with each EDAC processing level. In both cases the format of the encoded data is preserved at the processing output and the output of the second processing level is sent to the Decoder-Corrector Unit's fourth output port in the RS-232C format.

The FEC Decoder-Corrector 1902a prepares the Level 1 output by using the X Plane check bits to recognize, locate and correct what errors it can in the X Plane dimension, then removing the check bits, both the X Plane check bits and the Z Plane check bits, reformatting the data back into the RS-232C standard, and outputting a result via transmitter 1910.

The FEC Decoder-Corrector Level 1 error recognition, location and correction logic, in correcting what errors it can, will correct both the erroneous data bits and the X Plane check bits. The result of this Level 1 logic will be passed to the part of the FEC Decoder-Corrector logic that will perform the Level 2, Z Plane, error recognition, location and correction operations. The FEC Decoder-Corrector 1902a prepares the Level 2 output by using the Z Plane check bits to recognize, locate and correct what errors it can in the Z Plane dimension, then removing the check bits, both the X Plane check bits and the Z Plane check bits, and reformatting the data back into the RS-232C standard. The result of the Level 2 error recognition, location and correction operations is output via transmitter 1911.

The FEC Decoder-Corrector Level 2 error recognition, location and correction logic, in correcting what errors it can, will correct both the erroneous data bits and the Z Plane check bits. A fourth output (1912) of Decoder-Corrector Unit 1902a can be, if desired, connected to the input of a second Decoder-Corrector Unit 1902b for further EDAC processing (Level 3). The processing output 1912 will, in one embodiment, consist of the results of both the Level 1 and Level 2 error recognition, location and correction operations performed by Decoder-Corrector 1902a. The results of these two sequential operations, along with the X Plane check bits and the Z Plane check bits, are then reformatted according to the RS-232C channel standard and then made available to the second FEC Decoder-Corrector's 1902b via output 1912. Output 1912 will be identical in format to what the first FEC Decoder-Corrector 1902a received as its input from the Communication Channel; with fewer (and hopefully zero) errors. If this output 1912 from the first FEC Decoder-Corrector 1902a is connected to the input of a second FEC Decoder-Corrector unit 1902b then the same Level 0, Level 1, Level 2 and Level 3 processing will be performed within this second FEC Decoder-Corrector unit 1902b producing another set of outputs. The Level 0 output (not shown) of this second Decoder-Corrector unit 1902b will be identical to the Level 2 output of the first FEC Decoder-Corrector unit. The Level 1 output of the second FEC Decoder-Corrector unit 1902b (Level 1 output of the second Decoder-Corrector 1902b corresponds to the "Level 3 Corrected Output" of Decoder-Corrector 1902b in FIG. 19) will have undergone a second round of X Plane error recognition, location and correction operations and then reformatting for transmission to a computer, or other system. The Level 2 output of the second FEC Decoder-Corrector unit 1902b (Level 2 output of the second Decoder-Corrector 1902b corresponds to the "Level 4 Corrected Output" of Decoder-Corrector 1902b in FIG. 19) will have undergone a second round of X Plane error recognition, location and correction operations and subsequent Z Plane error recognition, location and correction operations and then reformatting for transmission to a computer, or other system. As before, during both the X Plane and the Z Plane error recognition, location and correction operations the X Plane check bits are corrected as is possible and retained and the Z Plane check bits are corrected as is possible and retained and the result is reformatted according to the RS-232C channel standard and then made available as the second FEC Decoder-Corrector's third level output (1913), which could be, if it is wanted, sent to a third FEC Decoder-Corrector unit (not shown) for still further processing.

While the principles of the invention have been described above in connection with the specific apparatus and associated methods set forth above, it is to be clearly understood that the above description is made only by way of example and not as a limitation on the scope of the invention as defined in the appended claims.

What is claimed is:

1. A method of transmitting a plurality of data bits over a transmission channel, said method comprising:
   (a) arranging the plurality of data bits into a sequence of data blocks each composed of an equal number of data bits;
   (b) arranging a portion of the sequence of data blocks into a first plurality of matrices, n, where each of said matrices has an equal number, y, of columns and rows, numbered 0 through y, where y is equal to twice the number of data bits in each data block plus an odd number equal to at least five, by:
      (i) setting a first counter, i, equal to one;
      (ii) arranging a first block of data bits in segment i of the sequence in a column i of a first matrix of the first plurality of matrices;
      (iii) setting a second counter, j, equal to one:
      (iv) arranging a next block of data bits in segment i of the sequence in column i of a matrix, (j+i), of the first plurality of matrices in accordance with the pattern used for arranging the data bits in column (j+i, modulo y+1) of the matrix, i, of the first plurality of matrices;
      (v) incrementing the second counter, j, by one;
      (vi) repeating steps (b)(iv)-(b)(v) until all matrices of the first plurality of matrices have data bits in their columns i;
      (vii) incrementing the first counter, i, by one; and
      (viii) repeating steps (b)(iii)-(b)(vii) until all columns of all matrices of the first plurality of matrices are filled with data bits;
   (c) generating one set of check bits, in a first processing arrangement, for each matrix having a plurality of data blocks and being a part of the first plurality of matrices and associating a corresponding check bit with the data bits of each block of data of each matrix of the first plurality of matrices;
   (d) repeating steps (b)-(c) for a second plurality of matrices with the data bits of the first column of the first matrix of the second plurality of matrices arranged as the data bits in the n+1$^{st}$ column of the first matrix of the first plurality of matrices, the first column of the second matrix of the second plurality of matrices arranged as the data bits in the n+2$^{nd}$ column of the first matrix of the first plurality of matrices, and continuing in a like manner until all columns of all matrices of the second plurality of matrices are filled with data bits;
   (e) generating one set of check bits, in the first processing arrangement, for each matrix having a plurality of data blocks and being a part of the second plurality of matrices and associating a corresponding check bit with the data bits of each block of data of each matrix of the second plurality of matrices;
   (f) repeating steps (d)-(e) for a third plurality of matrices with the data bits of the first column of the first matrix of the second plurality of matrices arranged as the data bits in the n+1$^{st}$ column of the first matrix of the second plurality of matrices, the first column of the second matrix of the second plurality of matrices arranged as the data bits in the n+2$^{nd}$ column of the first matrix of the second plurality of matrices, and continuing in a like manner until all columns of all matrices of the third plurality of matrices are filled with data bits;
   (g) generating one set of check bits, in the first processing arrangement, for each matrix having a plurality of data blocks and being a part of the third plurality of matrices and associating a corresponding check bit with the data bits of each block of data of each matrix of the third plurality of matrices;
   (h) repeating steps (f)-(g) for additional pluralities of matrices in like manners until sets of check bits are generated for each matrix of all n matrices of all y/n pluralities of matrices;
   (i) generating a second set of check bits, in a second processing arrangement, for a matrix whose columns correspond to the first columns of all of the matrices processed in steps (b)-(h);
   (j) generating a second set of check bits, in the second processing arrangement, for a matrix whose columns correspond to the second columns of all of the matrices processed in steps (b)-(h);
   (k) repeating step (j) for all columns of all matrices in the pluralities of matrices in like manners until y second sets of check bits for all matrices of all pluralities of matrices are generated;
   (l) transmitting at least an ordered set of pluralities of matrices having an ordered set of data blocks and each data block having two associated check bits in an order that is the same as an order in which the bits of the data blocks of each set of pluralities of data blocks are processed by the first processing arrangement;
   (m) receiving at least said ordered set of matrices having said ordered set of data blocks and each data block having two associated check bits at a decoder-corrector;
   (n) detecting and correcting in a first manner, with said decoder-corrector, one or more errors in the data bits or first check bit of the data blocks of said ordered sets of pluralities of matrices initially using the first sets of check bits generated for these data blocks according to the first processing arrangement.

2. The method of claim 1, wherein step (n) further comprises: detecting and correcting in a second manner, with said decoder-corrector, one or more errors that remain in the data bits using the second check bits generated for the data blocks according to the second processing arrangement.

3. The method of claim 2, wherein step (n) further comprises: repeating the detecting and correcting in the first manner, with said decoder-corrector, one or more errors that remain in the data bits or first check bits of the data blocks of said ordered set of pluralities of matrices using corrected first sets of check bits generated for the data blocks according to the first processing arrangement.

4. The method of claim 3, wherein step (n) further comprises: detecting and correcting in the second manner, with said decoder-corrector, one or more errors that remain in the data bits or second check bits of the data blocks of said ordered set of pluralities of matrices using corrected second check bits generated for the data blocks according to the second processing arrangement.

5. The method of claim 4, wherein step (n) further comprises: performing one or more further iterations of the following steps:
(i) detecting and correcting in the first manner, with said decoder-corrector, one or more errors that remain in the data bits or first check bits of the data blocks of said ordered set of pluralities of matrices using corrected first sets of check bits generated for the data blocks according to the first processing arrangement; and
(ii) detecting and correcting in the second manner, with said decoder-corrector, one or more errors that remain in the data bits or second check bits of the data blocks of said ordered set of pluralities of matrices using corrected second check bits generated for the data blocks according to the second processing arrangement.

6. The method of claim 1, where n is where n is equal to three or more.

7. The method of claim 6, where n is equal to an integer factor of y.

* * * * *